US012176183B2

(12) United States Patent
Lane et al.

(10) Patent No.: US 12,176,183 B2
(45) Date of Patent: Dec. 24, 2024

(54) RF VOLTAGE AND CURRENT (V-I) SENSORS AND MEASUREMENT METHODS

(71) Applicant: Tokyo Electron Limited, Tokyo (JP)

(72) Inventors: Barton Lane, Austin, TX (US); Merritt Funk, Austin, TX (US); Yohei Yamazawa, Tokyo (JP); Justin Moses, Austin, TX (US); Chelsea DuBose, Austin, TX (US); Michael Hummel, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 22 days.

(21) Appl. No.: 18/486,220

(22) Filed: Oct. 13, 2023

(65) Prior Publication Data
US 2024/0038496 A1 Feb. 1, 2024

Related U.S. Application Data

(62) Division of application No. 16/913,545, filed on Jun. 26, 2020, now Pat. No. 11,817,296.

(51) Int. Cl.
*H01J 37/32* (2006.01)
*G01R 29/08* (2006.01)

(52) U.S. Cl.
CPC .... *H01J 37/32174* (2013.01); *G01R 29/0878* (2013.01)

(58) Field of Classification Search
None
See application file for complete search history.

(56) References Cited

U.S. PATENT DOCUMENTS

| 5,867,020 A * | 2/1999 | Moore ............. G01R 19/28 |
| | | 324/95 |
| 6,708,123 B2 | 3/2004 | Gerrish |

(Continued)

FOREIGN PATENT DOCUMENTS

| KR | 20020016972 A | 3/2002 |
| KR | 20110024791 A | 3/2011 |

(Continued)

OTHER PUBLICATIONS

Lafleur, T., et al., "Radio frequency current-voltage probe for impedance and power measurements in multi-frequency unmatched loads," Review of Scientific Instruments 84, 2013, 015001, 11 pages on file with the the parent U.S. Appl. No. 16/913,545.

(Continued)

*Primary Examiner* — Eman A Alkafawi
*Assistant Examiner* — Suresh K Rajaputra
(74) *Attorney, Agent, or Firm* — Slater Matsil, LLP

(57) ABSTRACT

A radio frequency sensor assembly includes a sensor casing disposed around a central hole, the sensor casing including a first conductive cover and a second conductive cover. The assembly includes a cavity disposed around the central hole and includes a dielectric material, the cavity being bounded by a first major outer surface and a second major outer surface along a radial direction from a center of the central hole, where the first conductive cover is electrically coupled to the second conductive cover through a coupling region beyond the second major outer surface of the cavity, and electrically insulated from the second conductive cover by the cavity and the central hole. The assembly includes a current sensor electrically insulated from the sensor casing and including a current pickup disposed symmetrically around the central hole, the current pickup being disposed within the cavity and being insulated from the sensor casing.

18 Claims, 12 Drawing Sheets

(56) References Cited

U.S. PATENT DOCUMENTS

| | | |
|---|---|---|
| 7,084,369 B2 | 8/2006 | Sosnowski |
| 7,102,345 B2 | 9/2006 | Jackson |
| 7,113,838 B2 | 9/2006 | Funk et al. |
| 7,154,256 B2 | 12/2006 | Parsons et al. |
| 7,972,483 B2 | 7/2011 | Donohue et al. |
| 11,600,474 B2 * | 3/2023 | Lane .................... H01J 37/241 |
| 11,817,296 B2 * | 11/2023 | Lane ................. H01J 37/32174 |
| 2009/0210181 A1 * | 8/2009 | Swank ................. G01R 21/133 |
| | | 702/66 |
| 2011/0137446 A1 | 6/2011 | Valcore, Jr. et al. |
| 2012/0223697 A1 * | 9/2012 | Lee ..................... G01R 15/181 |
| | | 324/76.11 |
| 2018/0231587 A1 * | 8/2018 | Ye ..................... H01J 37/32174 |

FOREIGN PATENT DOCUMENTS

| | | |
|---|---|---|
| KR | 101679845 B1 | 12/2016 |
| KR | 101881573 B1 | 8/2018 |
| TW | 201737300 A | 10/2017 |

OTHER PUBLICATIONS

PCT International Search Report and Written Opinion, PCT Application No. PCT/US2021/037758, Oct. 8, 2021, 9 pages On file with the parent U.S. Appl. No. 16/913,545.

* cited by examiner

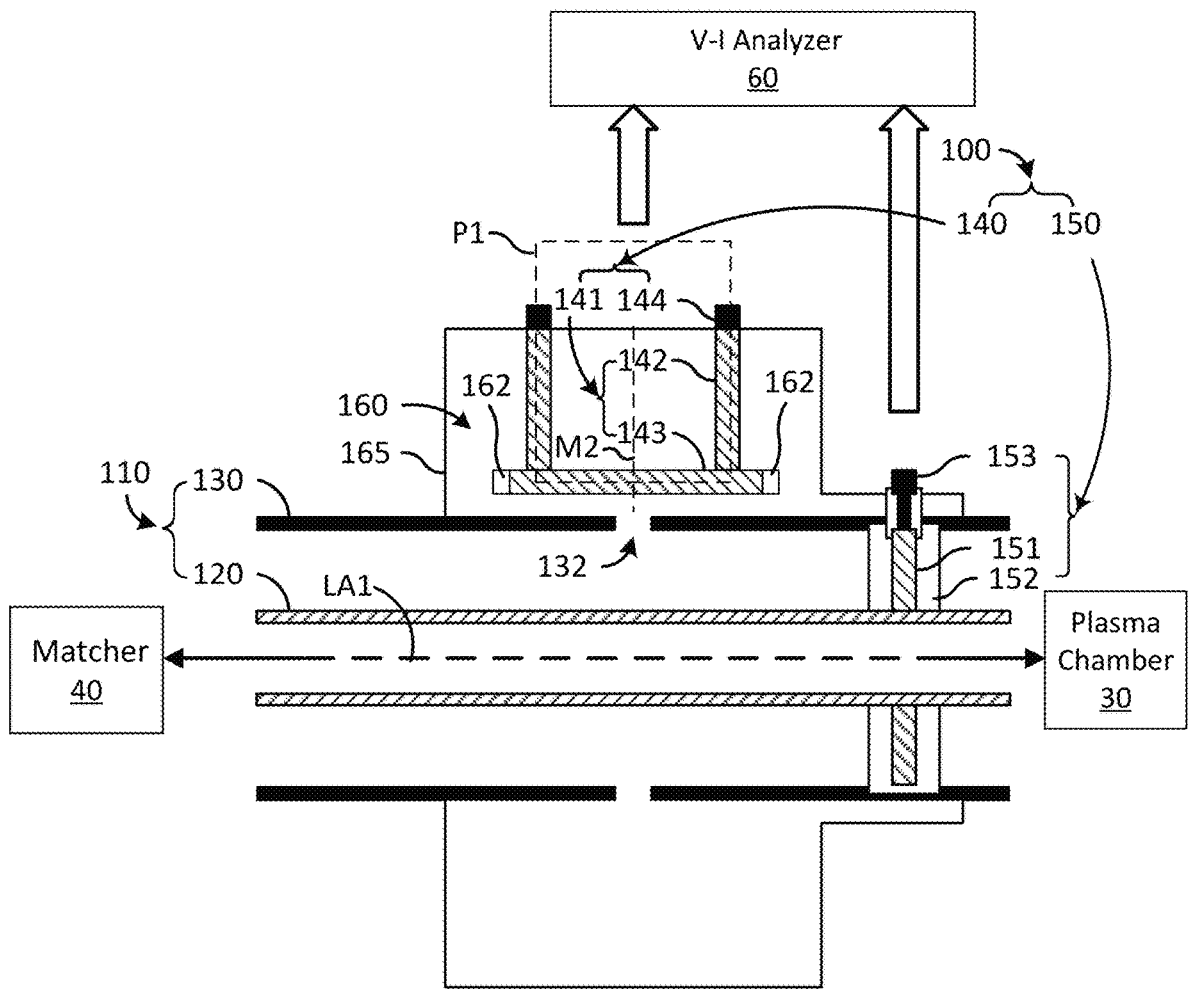
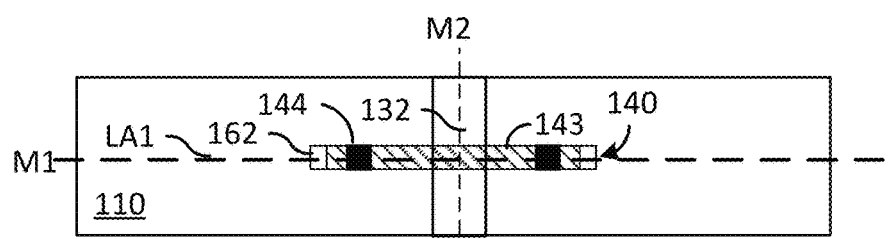
Figure 1B
Figure 1C

RF VOLTAGE AND CURRENT (V-I) SENSORS AND MEASUREMENT METHODS

CROSS-REFERENCE TO RELATED APPLICATIONS

This application is a divisional of U.S. Non-Provisional application Ser. No. 16/913,545, filed on Jun. 26, 2020, which is this application is related to U.S. Non-Provisional application Ser. No. 16/913,526, filed on Jun. 26, 2020, and U.S. Non-Provisional application Ser. No. 16/913,548, filed on Jun. 26, 2020, which applications are hereby incorporated herein by reference.

TECHNICAL FIELD

The present invention relates generally to plasma processing systems and methods, and, in particular embodiments, relates to radio frequency (RF) voltage and current sensors and measurement methods.

BACKGROUND

Generally, advancements in semiconductor integrated circuits (IC's) are driven by a demand for higher functionality at reduced cost. Higher functionality at lower cost is provided primarily by increasing component packing density through miniaturization. An IC is a network of electronic components (e.g., transistor, resistor, and capacitor) interconnected by a multilevel system of conductive lines, contacts, and vias. Elements of the network are integrated together by sequentially depositing and patterning layers of dielectric, conductive, and semiconductor materials over a semiconductor substrate using a fabrication flow comprising process steps such as chemical vapor deposition (CVD), photolithography, and etch. The packing density of circuit elements have been increased by periodically reducing minimum feature sizes with innovations such as immersion lithography and multiple patterning. Further miniaturization is achieved by reducing the device footprint with three-dimensional (3D) device structures (e.g., FinFET and stacked capacitor memory cell).

Plasma processes such as reactive ion etching (RIE), plasma-enhanced CVD (PECVD), plasma-enhanced atomic layer etch and deposition (PEALE and PEALD), and cyclic plasma process (e.g., cycles of alternating deposition and etch) are routinely used in the deposition and patterning steps used in semiconductor IC fabrication. The challenge of providing manufacturable plasma technology for advanced IC designs, however, has intensified with the advent of feature sizes scaled down to a few nanometers with structural features controlled at atomic scale dimensions. A manufacturable plasma process is expected to provide structures with precise dimensions (e.g., linewidths, etch depth, and film thicknesses) along with precisely controlled features for both plasma etch (e.g., sidewall angle, anisotropy, and selectivity to etch-stop layers) and plasma deposition (e.g., conformality, aspect-ratio selectivity, and area selectivity for bottom-up patterning), and uniformity across a wide (e.g., 300 mm) wafer. In many of the plasma processes used in IC manufacturing, the plasma is sustained by RF power. Since the plasma properties are influenced by the RF power delivered to the processing chamber, precise control of plasma processes may need innovative metrology of RF signals that are unobtrusive and accurate.

SUMMARY

In accordance with an embodiment of the present invention, radio frequency sensor assembly includes a sensor casing disposed around a central hole, the sensor casing including a first conductive cover and a second conductive cover. The assembly includes a cavity disposed around the central hole and includes a dielectric material, the cavity being bounded by a first major outer surface and a second major outer surface along a radial direction from a center of the central hole, where the first conductive cover is electrically coupled to the second conductive cover through a coupling region beyond the second major outer surface of the cavity, and electrically insulated from the second conductive cover by the cavity and the central hole. The assembly includes a current sensor electrically insulated from the sensor casing and including a current pickup disposed symmetrically around the central hole, the current pickup being disposed within the cavity and being insulated from the sensor casing.

In accordance with an embodiment of the present invention, a radio frequency (RF) sensor assembly includes a sensor casing disposed symmetrically around a central hole, the sensor casing including a first conductive cover and a second conductive cover. The assembly includes a cavity shaped like an annulus disposed symmetrically around the central hole and including a first dielectric material, the cavity being bounded by first and second major outer surfaces along a radial direction from a center of the central hole, the first major outer surface including a ring-shaped continuous region in physical contact with the central hole, and the second major outer surface including a closed outer boundary at a radial distance greater than a radius of the first major outer surface; a current sensor including a current pickup coil disposed symmetrically around the central hole, the current pickup being insulated from the sensor casing and the current pickup being disposed within the cavity. The assembly includes a conductive ridge shaped like a ring interposed between the current pickup and the central hole and electrically coupled to the second conductive cover, the conductive ridge being covered with the dielectric material.

In accordance with an embodiment of the present invention, a plasma system including a process chamber including an electrode; a radio frequency (RF) power source configured to power the process chamber with a RF signal; a RF pipe coupling the RF power source to the electrode of the process chamber; a mandrel shaped like a toroid disposed symmetrically around an axis of the RF pipe carrying the RF signal; and a voltage pickup disposed symmetrically around the axis of the RF pipe and surrounded by the mandrel.

BRIEF DESCRIPTION OF THE DRAWINGS

For a more complete understanding of the present invention, and the advantages thereof, reference is now made to the following descriptions taken in conjunction with the accompanying drawings, in which:

FIG. 1B illustrates a cross-sectional view of a V-I sensor for an RF pipe, in accordance with an embodiment;

FIG. 1C illustrates a top-sectional view of a current sensor of a V-I sensor for an RF pipe, in accordance with an embodiment;

FIG. 6D illustrates a perspective view of a current sensor element of the V-I sensor illustrated in FIG. 6A, in accordance with one embodiment;

Figure 1A:
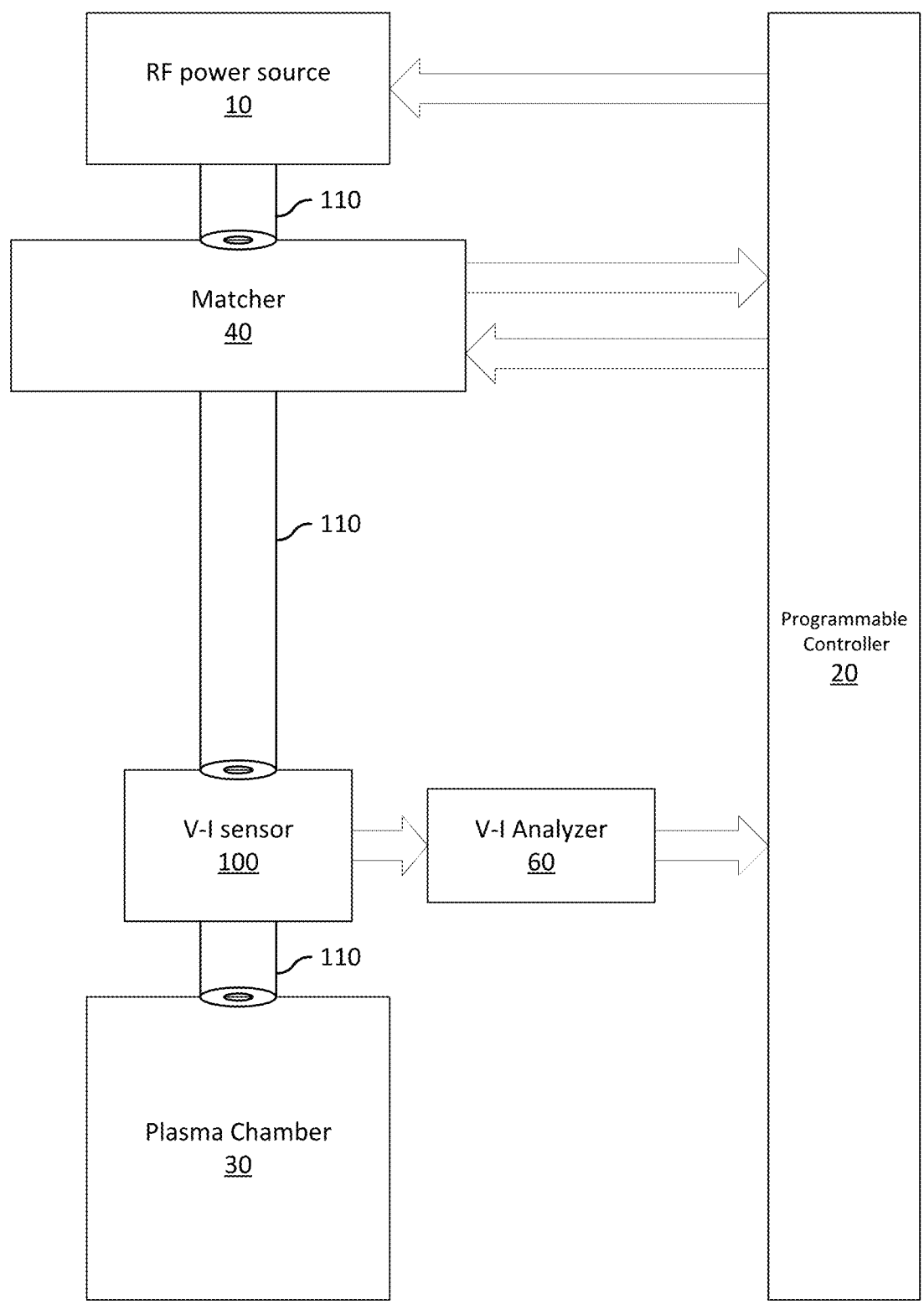
FIG. 1A illustrates a block diagram of a generic plasma processing system for semiconductor IC fabrication.

The last two digits of all the three digit reference numerals in FIGS. 1A through FIG. 7E always represent similar components.

DETAILED DESCRIPTION OF ILLUSTRATIVE EMBODIMENTS

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims.

This disclosure describes sensor designs and methods used for accurately measuring voltage (V), current (I), and the phase angle (Θ) between voltage and current of radio frequency (RF) electrical signals. The embodiments of the voltage-current (V-I) sensors described herein have been applied to probing the electric and magnetic fields of RF electromagnetic waves along coaxial transmission lines, referred to as RF pipes.

Plasma processes in semiconductor fabrication (e.g., plasma etch and deposition processes) often use RF power to sustain the plasma. As known to persons skilled in the art, the RF signal sustaining the plasma in the plasma chamber influences the plasma properties. The plasma properties (e.g., electron density, plasma sheath thickness, ratio of ion to radical flux, and others), in turn influence the etching and/or deposition characteristics of the plasma process.

In various embodiments, this application describes RF V-I sensors for measuring the current and voltage of the RF signal through an RF pipe. The term RF pipe refers here to a coaxial transmission line which carries RF power from one portion of a plasma reactor (referred to as a plasma processing system) to another. The waveforms, I and V, transmitted through an RF pipe are functions of position (x) and time (t), I(x, t) and V(x, t). When a single frequency component, f, is present, the current and voltage are described by sinusoidal waveforms written compactly as $\text{Re}(I(x)e^{j\omega t})$ and $\text{Re}(V(x)$ $e^{j(\omega t+\Theta)})$, where $\omega=2\pi f$, $j^2=-1$, and Re is the real part of the complex functions. As mentioned above, I and V each has a magnitude and each is separated from the other by a phase angle, Θ. In general, the waveforms, I and V, may include multiple frequency components. The voltage V(x, t) refers to the potential of the inner conductor (or core) of the RF pipe (or coaxial transmission line) relative to the grounded outer conductor (or shield), where ground denotes the reference potential of the RF system.

The RF V-I sensors, as described in various embodiments, may use geometrical symmetry and differential measurement methods to provide V and I with high precision at the position of the sensor. Several V-I sensors may be used at various locations along the RF pipes to probe the RF signals there. Since V and I are functions of position, x, each V-I sensor may be positioned as close as possible to the respective desired measurement location. For example, if it is desirable to monitor and control the plasma process using accurate measurements of the voltage and current of the RF signal provided to the plasma chamber then the V-I sensor used for that purpose may be positioned close to where the RF signal enters the plasma chamber. The various embodiments described herein enhance the measurement accuracy and sensitivity of V-I sensors without increasing cost, thereby providing plasma processing systems enhanced ability to provide plasma processes with better repeatability and tighter process control for the same cost. Additionally, the RF probes are designed to be unobtrusive to allow ease in retrofitting existing plasma processing equipment with the improved V-I sensors without time-consuming and expensive re-development of established recipes for plasma processes in a production flow.

In this disclosure, the use of V-I sensors in plasma processing systems is explained first, with reference to a block diagram illustrated in FIG. 1A. Next, the basic structure and operating principle of a V-I sensor in a plasma processing system is described with reference to the schematic illustrated in FIG. 1B in accordance with an embodiment. Some of the innovative aspects of the V-I sensor designs (designs similar to the basic structure in the schematic in FIG. 1B) are then explained with reference to example embodiments of V-I sensors illustrated in FIGS. 2A, 2B, 3, 4, and 5.

As described in detail below with reference to FIG. 1B, the voltage sensors in the embodiments in FIGS. 2A, 2B, 3, 4, and 5 have axial symmetry, being designed as conductive rings placed inside the RF pipe looping around the central longitudinal axis that runs parallel to the direction of current flow. The advantages provided by the axisymmetric design have been explained in the discussion below with reference to FIG. 2B.

The respective current sensors in the example embodiments are located in a sleeve or gallery around the circumference outside of the RF pipes. The gallery is the cavity inside a sensor casing. The sensor casing has conductive walls that cover the gallery and may be connected to the outer conductor of the RF pipe and, thereby connected to ground. As described in detail below with reference to FIG. 1B, the current sensor is a single conductive loop with two open ends (referred to as a half-loop); the loop being completed using, for example, components of an external V-I analyzer connected to the current sensor by coaxial cables. A V-I analyzer is a measurement system that analyzes the raw signals received from the current and voltage sensors. As explained further below, both ends of the current sensor may be connected to the V-I analyzer to make a differential measurement for an accurate analysis. However, to simplify the system at the cost of accuracy, only one of the ends of the current sensor may be connected to the V-I analyzer and the other end terminated by a load impedance (e.g., by 50 ohm load) to ground or shorted to ground. The ground connection may be a direct connection to the sensor casing. In this configuration, the outer ground cover of the gallery is in the circuit between the two ends of the half-loop contributing significantly to complete the loop. In an alternate RF system using embodiments of the current sensors described in this disclosure, the entire closed loop may be contained within the gallery with appropriate impedance matching and one or more external signal connections.

In the example embodiments described with reference to FIGS. 1B-5, the current loop of the half-loop current sensor has one conductive turn comprising three conducting elements. The three conductive elements of the half-loop of the current sensor are two identical vertical branches connected by a horizontal branch oriented parallel to the central axis of the RF pipe. Accordingly, the current sensor designs discussed herein have minor symmetry about a minor plane normal to the central axis of the RF pipe and passing half-way between the two vertical branches. The advantages of having reflection symmetry have been explained in the discussion below with reference to FIG. 2B. However, being located on one side of the RF pipe, the single-turn half-loop current sensors are lacking in axial symmetry. Axisymmetric multi-turn half-loop current sensor designs are described with reference to FIGS. 6A-7E, wherein the embodiments utilize toroidal mandrels to mechanically support the multi-turn current pickups.

The innovative aspects of the V-I sensor designs described in this disclosure may provide several advantages. For example, non-intrusive probing of the electric and magnetic fields of the electromagnetic wave has been used to allow performing the V-I measurements with negligible disturbance of the RF signal in the RF pipe. Also, geometrical symmetry and differential measurement techniques are advantageously utilized in the sensor designs to provide measurements that may be insensitive to machining errors due to standard tolerances of the tools used to form the components as well as positioning errors during assembly of the V-I sensors. In addition, several structural enhancement techniques have been utilized; for example, duplicate placement of an element of the V-I sensor may be done to enhance geometrical symmetry, and parts designed to provide extra mechanical support may be placed to reduce/suppress even small deformations in the shape of critical sensor components caused by mechanical stresses during assembly. Thus, by using the embodiments described in this disclosure, RF V-I measurements with improved precision may be achieved without incurring the increased cost of tighter machining tolerance.

FIG. 1A is a block diagram of a generic plasma processing system that may be used for semiconductor IC fabrication.

Referring now to FIG. 1A, in a plasma processing system, an RF signal may be generated by a high power RF power source 10, for example, an RF oscillator coupled to an RF power amplifier. The RF signal waveform (e.g., frequency, amplitude, pulsed/continuous, and the like) may be adjusted by a programmable controller 20 and associated electronic circuitry. The RF signal may be transmitted via a conduit, e.g., an RF pipe 110, to bring RF power to electrodes coupled to the plasma inside the block indicated as plasma chamber 30 in FIG. 1A.

As known to persons skilled in the art, the RF signal in the RF pipe 110 may be represented as a combination of travelling RF electromagnetic waves. Impedance mismatch between the output impedance of the RF power source 10 and the load impedance results in a fraction of the RF power travelling from the RF power source 10 towards the load getting reflected back to the RF power source 10. In order to suppress such unwanted reflections, a matcher 40 comprising a matching network may be inserted in the RF signal path between the RF power source 10 and the plasma chamber 30, as illustrated in FIG. 1A. A ratio of reflected power to incident power of the matching network may be sensed by the matcher 40 (e.g., using a V-I sensor and analyzer) and provided to the programmable controller 20. The programmable controller 20 may reduce the RF power reflected back to the RF power source 10 from the matching network by adjusting its impedance using, for example, a feedback control loop (indicated in FIG. 1A by two arrows between the matcher 40 and the programmable controller 20).

Plasma may be sustained in the plasma chamber 30 using, for example, RF power delivered by RF pipe 110 from the RF power source 10 to an electrode of the plasma chamber 30. As illustrated in FIG. 1A, a V-I sensor 100 may be used to sense the current and voltage of the RF signal provided to the electrode. In various plasma chamber designs, the electrode may be inside the chamber walls, e.g., a disc-shaped electrode in capacitively coupled plasma (CCP) chambers or an antenna outside the chamber walls. For example, in inductively coupled plasma (ICP) chambers the antenna may be a conductive planar spiral placed above a dielectric window, or a conductive helix wound around a dielectric cylinder. The block, indicated as plasma chamber in FIG. 1A, includes electrodes and antennas coupled to the plasma. For simplicity, in this disclosure, the term electrode refers to electrode and/or antenna. The plasma chamber 30 comprises at least two electrodes, for example, a top electrode and a bottom electrode electrically coupled to the plasma between them. In some designs, it may be advantageous for the bottom electrode to also be the substrate holder.

Although the block diagram in FIG. 1A shows the RF pipe 110 delivering RF power to the plasma chamber 30 from a single RF power source 10, there may be more than one RF power source providing RF power to more than one electrode. For example, the RF power source may provide RF power to an electrode (e.g., the top electrode) of the plasma chamber 30, and a second RF bias power source may supply RF bias power to another electrode (e.g., the bottom electrode) of the plasma chamber 30, using respective RF pipes, matcher, and V-I sensor positioned close to the plasma chamber to sense the voltage and current of the RF signal provided to the bottom electrode.

In FIG. 1A, the V-I sensor 100 used to sense and measure the current and voltage of the RF signal close to the electrode receiving the RF signal is connected to a V-I analyzer 60. A V-I analyzer 60 may receive the raw output waveforms from the V-I sensor 100, reflective of V(t) and I(t), as indicated by an arrow. The V-I analyzer 60 may be a signal processor, for example, a digital signal processor, that may extract various RF signal characteristics from the raw waveforms. The various RF signal characteristics may include the magnitudes |V|, |I|, the phase angle ($\Theta$) between V and I, and peak RF power $|V||I| \cos \Theta$. In addition, harmonic analysis may be done to extract multiple frequency components. The measured RF signal characteristics may be reflective of the plasma impedance and plasma properties such as free electron and ion densities and ion/radical flux and energy. The V-I analyzer 60 may be pre-calibrated using, for example, RF calibration signals over a range of frequency (e.g., from about 0.4 MHz to about 1

GHz) and power (e.g., from about 0.15 kW to about 30 kW), standard load impedances (e.g., short circuit, open circuit, 50 ohms, and the like), and a vector network analyzer (VNA).

As indicated by an arrow in FIG. 1A, various RF signal characteristics reflective of plasma properties may be provided to the programmable controller 20 by the V-I sensor 100 and the V-I analyzer 60 and used, for example, for process monitoring or end-point detection. In addition, the programmable controller 20 may use the received RF measurements for process control. As known to a person skilled in the art, the plasma properties may be altered by altering the RF signal coupled to the plasma. The programmable controller 20 may control the plasma process using the information from the RF measurements; for example, by adjusting the settings of the RF power source 10, or by adjusting the impedance of the matching network of the matcher 40.

In embodiments where the V-I sensor 100 is used to estimate and control parameters of the plasma, it may be advantageous to locate the V-I sensor 100 close to the plasma chamber 30. The V and I of the RF signal at the electrode location may be estimated from the V and I measured at a different location by a V-I sensor 100 located there. However, the errors in measurement of V and I at the electrode may increase as the distance between the electrode and the V-I sensor is increased. Theoretically, the transfer matrix used to transform the sensor signals between two locations deviates further from the unity matrix as the distance between the two locations increase. Accordingly, the V and I estimated for the electrode location become increasingly sensitive to any error in estimating the respective transfer matrix.

Referring now to FIG. 1B, a V-I sensor 100 is attached to an RF pipe 110 that connects to a plasma chamber 30, in accordance with one embodiment. The RF pipe 110 may be a coaxial structure comprising two conductive tubes (e.g., aluminum or copper tubes) placed concentrically about a shared longitudinal axis. The inner conductive tube, referred to as the inner conductor 120, may be electrically connected to the output terminal of matcher 40 indicated by an arrow pointing to the left. The outer conductive tube, referred to as the outer conductor 130, may be a grounded sheath connected to a reference potential, generally referred to as ground. The RF pipe 110 may be referred to as the main coaxial line since it carries the RF power from the matcher 40 to the plasma chamber 30. Other coaxial lines in this disclosure are referred to as coaxial signal lines (e.g., coaxial lines which may be used to carry signals from the V-I sensor 100 to the V-I analyzer 60).

The V-I sensor 100 comprises two primary components: a current sensor 140 and a voltage sensor 150. The current sensor 140 may be disposed in an annular gallery 160 inside a sensor casing 165 with conductive walls (e.g., aluminum, brass, stainless steel, or copper). In the embodiment shown schematically in FIG. 1B, the gallery 160 is a hollow annular region which follows a complete circumference outside of the outer conductor 130 and is axisymmetric about the axis of the RF pipe 110. The axisymmetric design of the gallery 160 provides the advantage of preventing additional reflections and non-axisymmetric wave modes of the RF electromagnetic waves propagating in the RF pipe 110. The gallery 160 and the conductive sensor casing 165 may be formed either integrally with the RF pipe 110 or be able to be symmetrically attached around the RF pipe 110 and positioned during assembly to help avoid alignment errors between the longitudinal axis of the RF pipe 110 and the current sensor 140. In either case, the conductive sensor casing 165 and the outer conductor 130 are electrically and physically connected. Accordingly, the sensor casing 165 may be considered to be an extension of the outer conductor 130 of the coaxial RF pipe 110.

Although the embodiment in FIG. 1B has an annular gallery 160, in some other embodiment the gallery may not be annular. In some other embodiment, the axisymmetry of the RF pipe 110 may have been unavoidably broken by, for example, bends in the RF pipe 110 and, as such, additional loss of axisymmetry due to an asymmetry in the V-I sensor design may be insignificant. It may then be reasonable to relax the axisymmetry in the V-I sensor design. For example, the gallery may follow the circumference of the outer conductor 130 partially and not make a complete circuit of the RF pipe 110.

Referring to FIGS. 1B and 1C, the gallery 160 is shown completely enclosed by a conductive surface of the sensor casing 165 and the outer conductor 130 except for a slit 132 connecting the hollow regions of the gallery 160 and the RF pipe 110. A current pickup 141 of the current sensor 140 is shown located in the gallery 160 directly above the slit 132. In the embodiment illustrated in FIGS. 1B, the current pickup 141 comprises three conductive branches arranged as three sides of a rectangle (referred to as a half-loop): two vertical branches 142 and a horizontal branch 143. In one embodiment, the two vertical branches 142 are each screwed into an opening in the horizontal branch 143.

In the embodiment in FIG. 1B, the vertical and horizontal branches of the current pickup 141 are formed using three separate parts. In some other embodiment, a different number of parts (less/more) may be used.

The slit 132 is designed to permit the magnetic flux to penetrate into the gallery 160. Current flowing in the inner conductor 120 results in magnetic flux circulating around the inner conductor 120 about the longitudinal axis LA1 in the region between the inner conductor 120 and the outer conductor 130. Without the slit 132, the magnetic flux outside the outer conductor 130 would be roughly zero because an equal but opposite return current flowing on the inner surface of the outer conductor 130 would cancel out the circulating magnetic flux due to the current in the inner conductor 120, in accordance with Ampere's law. The slit 132 diverts the return current to flow along the inner surface of the outer conductive body of the sensor casing 165 by breaking the continuity in the cylindrical outer conductor 130. Thereby, the hollow region of the gallery 160 containing the half-loop current pickup 141 falls inside the region between the current flowing in the inner conductor 120 and the respective return current. By Ampere's law, there is now a magnetic field inside the gallery 160 threading through the rectangular half-loop of the current pickup 141. In one example, the slit 132 may extend along the entire circumference of the cylindrical outer conductor 130 to help maximize the magnetic flux which threads the half-loop of the current pickup 141.

In addition to the magnetic flux, there is electric flux emanating from the inner conductor 120 due to a voltage difference between the inner conductor 120 and the grounded outer conductor 130. Unwanted electric flux may leak into the gallery 160 through a gap in the grounded sheath provided by the slit 132 made in the outer conductor 130. The changing magnetic flux threading through the half-loop of the current pickup 141 induces an electrical signal that is a measure of I(t) at that location. However, electric flux entering the gallery 160 may couple with the current pickup 141 and contaminate the signal produced by the magnetic flux. Accordingly, as illustrated in FIG. 1C, slit 132 has been designed to have a width (dimension parallel to LA1) about 1 mm to about 5 mm. The width of the slit 132 may be kept narrow to help reduce the electric flux entering gallery 160 from inside the RF pipe 110.

Although the slit design used for the embodiments of V-I sensors described with reference to FIGS. 1B-5 are shaped like a ring along the circumference of the outer conductor, it is understood that various other designs are possible. For example, a zig-zag slit design has been used in a current sensor assembly described with reference to FIG. 7A-7E.

The conductive parts of the current sensor 140 may be insulated from the conductive surfaces of the outer conductor 130 and the sensor casing 165 by air gaps (or other insulators) and by insulating components used for mechanical support, such as the insulating parts 162 in FIG. 1b (and similar other parts shown in FIGS. 2A-5).

The current pickup 141 is topologically a half-loop (a loop with two open ends) making one turn around a region with a rectangular cross-section with its two vertical branches 142 and a horizontal branch 143. The single-turn half-loop current pickup 141 may be positioned in presence of a time-varying magnetic field originating from RF electromagnetic waves traveling along the RF pipe 110. By Faraday's law, a time-varying voltage difference may be induced between the two ends of the current pickup 141 proportional to the time-varying magnetic flux. The two ends of the current pickup 141 may be attached to a symmetric pair of terminals 144 shown above the sensor casing 165 in FIG. 1B. In one embodiment, the terminals 144 may be coaxial cable connectors used to connect coaxial signal lines.

As explained in further detail below, it is advantageous to use a symmetric design for the current pickup 141. The symmetry is utilized by a measuring system (e.g., the V-I analyzer 60 in FIGS. 1A and 1B) to cancel out parasitic signals in the two vertical branches 142 by measuring, for example, the differential voltage between the two terminals 144 of the current sensor 140. For this measurement method, the differential signal from the current sensor 140 is its output signal, and may be detected using, for example, a differential amplifier.

The half-loop of the current pickup 141 is completed external to the V-I sensor by a combination of terminating impedances, input impedances of an initial detection system, and impedances of cables (if cables are used to transmit the output signal of the current sensor 140 to the initial detection system of the measuring system). If the initial detection system is placed at the current sensor 140 itself then the requirement of matching the detector impedance to cable impedances may be lifted. If the measuring system is remote from the current sensor 140 then the terminals 144 may be connected to the initial detection system of the measuring system using coaxial signal lines comprising, for example, coaxial cables. Coaxial cables have impedances typically in the range of about 20 ohms to about 300 ohms. It is advantageous to terminate the coaxial signal lines with matching impedances in order to avoid reflections from the measuring system due to the impedance mismatch. It is also advantageous to connect the two end terminals 144 of the current sensor 140 to symmetric coaxial signal lines terminated in a symmetric fashion, thereby preserving the symmetry of the output signals of the current sensor 140. For example, in one embodiment, a pair of identical 50 ohm coaxial cables with 50 ohm terminations may be used.

As mentioned above, use of the differential signal as the output signal of the current sensor provides higher accuracy in measuring I. In order to detect the differential signal, the pair of signals from the pair of terminals 144 has to be provided to the initial detection system using, for example, a pair of coaxial cables. However, with some loss in accuracy, the current sensor may also be used in conjunction with a measuring system that detects the signal at one of the terminals of the pair of terminals 144. In systems that detect the signal at a first terminal of the pair of terminals 144 (instead of detecting the differential signal), the second terminal of the pair of terminals 144 may be connected to impedances that reflect the impedances at the first terminal as closely as possible. For example, the first terminal may be connected to a first 50 ohm coaxial cable to transmit the signal to a 50 ohm input port of an initial detection system, and the second terminal may be connected to a second identical 50 ohm coaxial cable having a 50 ohm termination at the end of the cable instead of a detector. It should be noted that some other appropriate impedance may be used for termination; the impedance is not required to be 50 ohms. Furthermore, the second coaxial cable may be omitted and the appropriate impedance termination be affixed directly to the second terminal of the pair of terminals 144.

The design of the measuring system, including the elements used to connect the current sensor 140, also takes into consideration impedances to ground due to parasitic capacitances of the electronic components. Because of the frequency dependence of the parasitic capacitive impedances, the impedance of a component at RF frequencies may differ significantly from the component's impedance at a low frequency or at DC (zero frequency). For example, the impedance of a resistor component at DC may get reduced as the frequency of the electrical signal is increased to the RF range because of parasitic capacitance to ground associated with the resistor structure. The impedance of a resistor having a higher value of resistance is more sensitive to the frequency of the RF signal. Since the parasitic capacitance to ground depends on the geometry and the geometrical environment in which the resistor is placed, it is difficult to control the variations in impedance from unit to unit if the resistor has a high value of resistance. Thus, in order to maintain measurement accuracy, it is advantageous to restrict the design of the initial detection system to using resistors whose resistance value is less than 0.1 of its parasitic RF reactance, even when the initial detection system is placed at the sensor location.

A voltage pickup 151 of the voltage sensor 150 comprises a conductive ring that may be placed along the inner surface of the outer conductor 130. The outer conductor 130 and the conductive voltage pickup 151 may be insulated from each other by an insulating ring 152, as illustrated in FIG. 1B. The insulating ring 152 may comprise Teflon, or some other plastic materials, or some other suitable dielectric. In one embodiment, the voltage pickup 151, such as the conducting ring, may be exposed to the air (or other insulator) between the inner conductor 120 and the outer conductor 130. In another embodiment, voltage pickup 151 may be embedded in an insulating housing. In all embodiments, the voltage pickup 151 (e.g., the conducting ring) may be electrically insulated from the outer conductor 130 and mechanically supported by an insulating structure.

In one embodiment, the inner diameter of the voltage pickup 151 (e.g., the conducting ring) may be the same as the inner diameter of the outer conductor 130. In some other embodiment, the inner diameter of the voltage pickup 151 (e.g., the conducting ring) may be different (smaller or larger than the inner diameter of the outer conductor 130). The perturbation to the electric and magnetic fields in the RF pipe 110 caused by inserting the voltage pickup 151 is relatively the lowest when the inner diameter of the voltage pickup 151 (e.g., the conducting ring) and the inner diameter of the outer conductor 130 are equal. The output signal from the voltage pickup 151 increases as the inner diameter of the voltage pickup 151 (e.g., the conducting ring) decreases, as explained in further detail below. A contact to the voltage pickup 151 extends outside the outer conductor 130 and terminates at a third terminal 153 (e.g., a third coaxial cable connector) attached above the sensor casing 165. The current pickup 141, the voltage pickup 151, and the contacts to the respective terminals 144 and 153 may comprise a metal (e.g., copper) with high electrical conductivity, and may all be insulated from other conductive elements such as the outer conductor 130 and the conductive sensor casing 165.

The considerations for the design for the termination impedance and coaxial signal line connecting an initial detection system to the terminal 153 of the voltage sensor 150 may be similar to that for the termination impedances and coaxial signal lines connecting an initial detection system to the terminals 144 of the current sensor 140, as discussed above. The discussion above, with reference to the current sensor 140, includes considerations for preserving symmetry of the differential output signal. However, that portion of the discussion is not applicable to the voltage sensor because, in the embodiment of the V-I sensor 100, the voltage sensor 150 has only one ring-shaped voltage pickup 151 and one terminal 153, whereas the current sensor 140 has a pair of terminals 144. Symmetry considerations may be applicable in another embodiment, where two voltage pickup rings are placed symmetrically and an arithmetic mean of the two signals may be used, for example, in the V-I sensor 300, described with reference to FIG. 3.

As illustrated in FIGS. 1B and 1C, the longitudinal axis LA1 of the RF pipe 110 is in the plane P1 of the current pickup 141. The longitudinal axis LA1 is also parallel to the direction of the current in the RF pipe 110. In addition, as is more easily observed in FIG. 1C, along a direction orthogonal to the longitudinal axis LA1 of the RF pipe 110, the current pickup 141 comprises a first plane of mirror symmetry M1 comprising the longitudinal axis LA1 of the RF pipe 110 and a second plane of mirror symmetry M2 orthogonal to the first plane of mirror symmetry M1. The first plane of mirror symmetry M1 of the current pickup 141 and the longitudinal axis LA1 of the RF pipe 110 are co-planar in one or more embodiments.

The magnetic field lines are roughly concentric around the longitudinal axis LA1, passing perpendicularly through the plane P1 of the half-loop. In this configuration, the magnetic field gets inductively coupled to the current pickup 141 (as is desired). Undesirable coupling to the electric field is greatly weakened by locating the current pickup 141 outside the outer conductor 130. The inductively coupled oscillating magnetic field induces an electromotive force (emf) in the current pickup 141 (the three-sided half-loop). The induced emf is related to the changing magnetic flux, in accordance with Faraday's law. Since the strength of a magnetic field around a current-carrying conductor is reflective of the respective electrical current, the current sensor 140 may generate a time-varying electrical signal reflective of the RF current in the RF pipe 110 at the respective location. An aspect of the current sensor 140 is that that the electrical signal at both of the terminals 144 may be received by the detection system, and the differential voltage between the two terminals 144 be used as the output signal of the current sensor 140. The advantage provided by the differential output technique is explained in further detail below with reference to FIG. 2B.

The electric potential and electric field magnitude contours are roughly circles with their centers on the longitudinal axis LA1 of the RF pipe 110. The circular contours are contained in the family of planes normal to the longitudinal axis LA1. Thus, the electric field lines are radially directed from the inner conductor 120, perpendicular to the longitudinal axis LA1. The ring-shaped voltage pickup 151 is located roughly on one of the circular contours. For this configuration, the oscillating electric field in the space outside the inner conductor 120 is capacitively coupled to the voltage pickup 151, and the conductive ring attains an oscillating electric potential roughly proportional to the electric potential of the inner conductor at the respective position, in accordance with the physical laws of electromagnetism. This oscillating electric potential may be used as the output signal of the voltage sensor 150. The magnitude of the radial electric field between the inner conductor 120 and the outer conductor 130 decreases with increasing radial distance from the longitudinal axis LA1, in accordance with Gauss' law. Accordingly, the output signal of the voltage sensor 150 may be increased by positioning its voltage pickup 151 closer to the inner conductor 120, for example, by reducing the inner diameter of the voltage pickup ring.

While the voltage pickup 151 is capacitively coupled to the electric field, there is almost no coupling with the magnetic field because the magnetic flux normal to the plane of the ring-shaped voltage pickup 151 is negligible for this geometry. Since the strength of the electric field around a conductive tube (the inner conductor 120 in this example) is reflective of the electric potential of the conductor, the voltage sensor 150 may generate a time-varying electrical signal reflective of the RF voltage on the RF pipe 110 at the respective location.

The raw output signals (e.g., one pair from the current sensor 140 and another from the voltage sensor 150) may be transmitted to a V-I analyzer 60, as indicated by arrows (see also FIG. 1A).

Figure 2A:
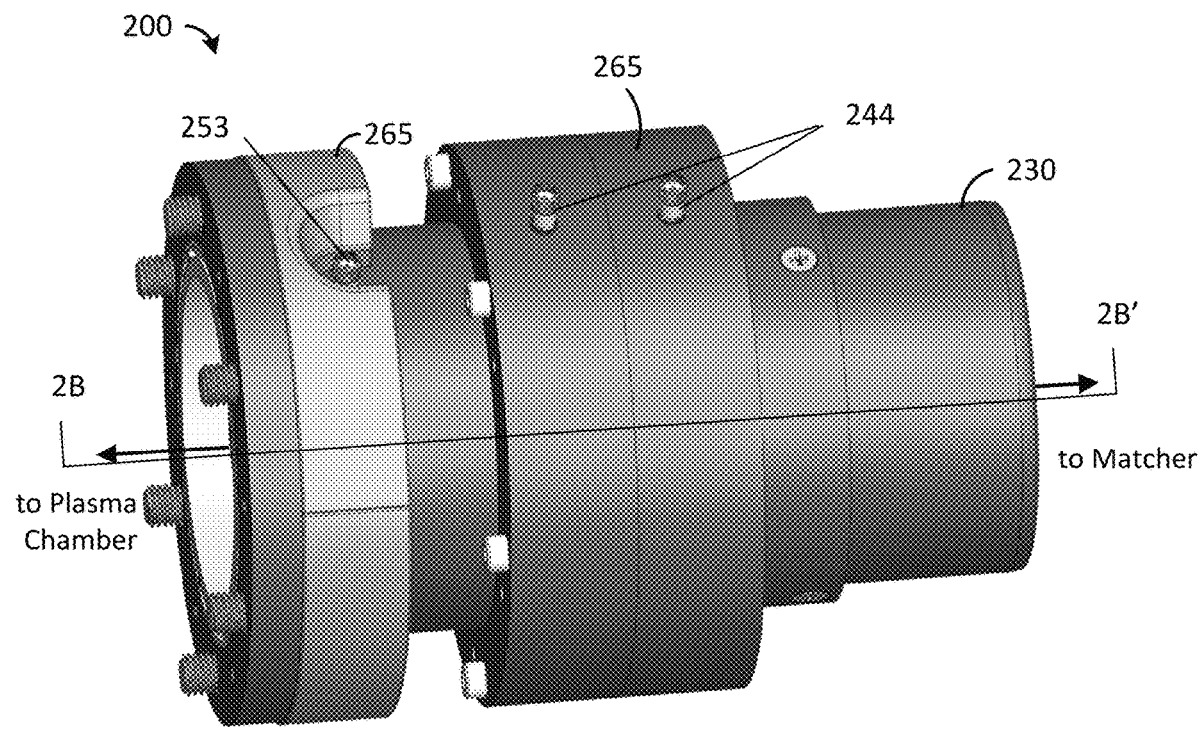
FIG. 2A illustrates a perspective view of a V-I sensor for an RF pipe, in accordance with an embodiment.
Figure 2B:
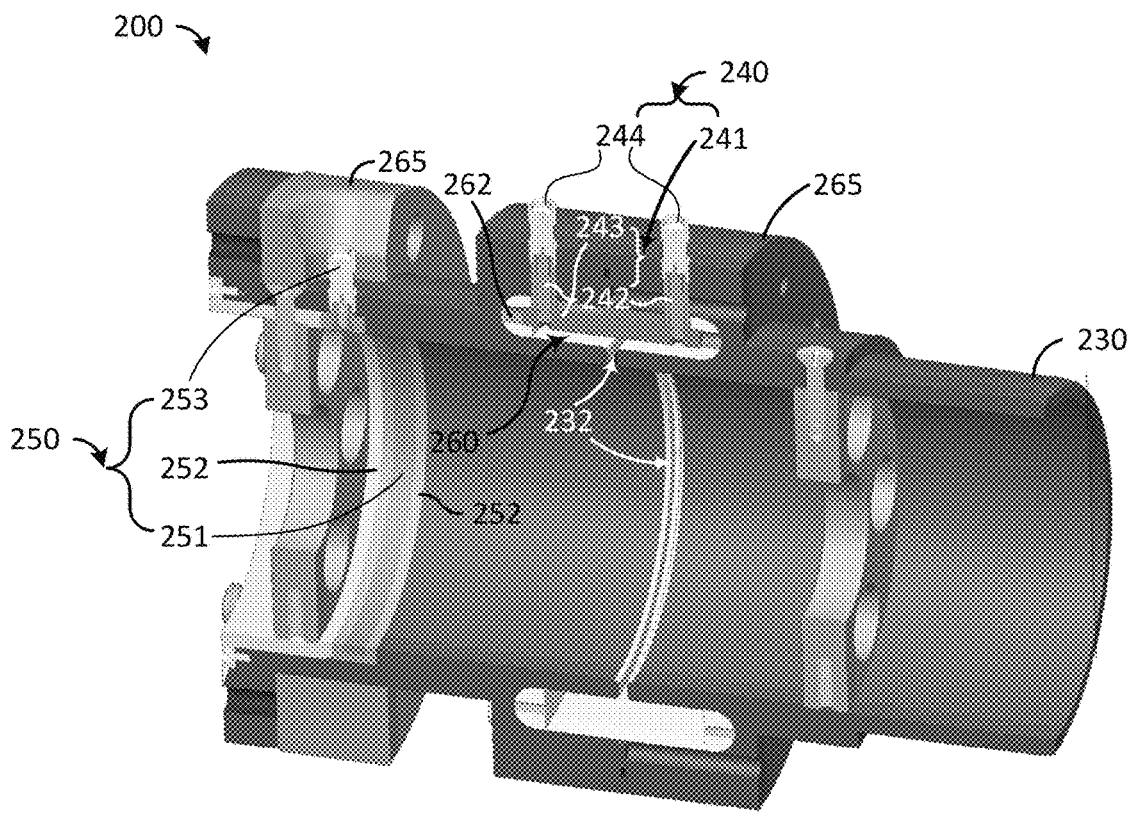
FIG. 2B illustrates a cutaway diagram of the V-I sensor illustrated in FIG. 2A.

FIG. 2A illustrates a perspective view of a V-I sensor 200 and the outer conductor 230 (the outer tube) of an RF pipe. FIG. 2B illustrates a cutaway view of the same V-I sensor 200 along an axis 2B-2B'. The V-I sensor 200 in FIGS. 2A and 2B is similar to the V-I sensor 100 in FIG. 1B. The current sensor 240 and the voltage sensor 250 are placed within the annular gallery 260 of the V-I sensor 200. In FIGS. 2A and 2B, the inner conductor of the RF pipe has been removed to better illustrate the voltage pickup ring 251 of the voltage sensor 250 inside the outer conductor 230. The perspective view (FIG. 2A) shows three terminals (coaxial cable connectors in this example) of the V-I sensor 200. The pair of terminals 244 extending above the top of the gallery 260 connect to the current pickup 241 of the current sensor 240, as seen in FIG. 2B. The third terminal 253 connects to the voltage pickup 251 of the voltage sensor 250.

Referring to FIG. 2B, the current pickup 241 of the current sensor 240 is a half-loop comprising three conductors. Two conductive vertical branches 242 of the current pickup 241 are insulated by plastic (or other insulating materials) from the metallic sensor casing 265. The vertical branches 242 connect to two ends of a horizontal branch 243, which is a third conductor disposed horizontally inside the gallery 260 above the outer conductor 230. A slit 232 along a circumference of the outer conductor 230 allows the magnetic field to thread through the plane of the half-loop and induce an electromotive force in the conductive branches of the current pickup 241. The horizontal branch 243 of the current pickup 241 may be attached to a horizontal non-conductive (e.g., plastic) parts 262 along the side of the conductor. In the example embodiment of the V-I sensor 200 illustrated in FIGS. 2A and 2B, the horizontal branch 243 is insulated from the grounded metallic sensor casing 265 and the outer conductor 230 by plastic parts 262 on the sides and by air in the gap between the bottom of the horizontal branch 243 and the top of the outer conductor 230. In another embodiment, described in further detail below, the mechanical support for the horizontal branch 243 may be strengthened by additional plastic parts placed in the air gap below the horizontal conductor.

The current pickup (e.g., the current pickup 240 in FIG. 2B) provides an electrical signal through its interaction with the RF electromagnetic fields. As explained above, it is the magnetic field (not the electric field) that is reflective of the RF current. A slit 232 allows penetration of the magnetic field from the RF pipe into the gallery 260 in which the current pickup 241 is located. Any coupling of the current pickup 241 to the electric field degrades the precision in the measurement of the magnetic field. The current sensor 240 may suppress the measurement error that may arise from unwanted interaction with the electric field, as explained herein. First, the current sensor 240 in the V-I sensor 200 is placed outside the grounded outer conductor 230, thereby using the outer conductor 230 to shield the electric field. As mentioned above with reference to FIGS. 1B and 1C, the RF electric field is in the radial direction (perpendicular to the coaxial axis LA1 of the RF pipe and, accordingly, the electric flux leaking into the gallery is roughly directly proportional to the slit width, defined above as the dimension parallel to LA1. The width of slit 232 may be selected to be relatively small to reduce the amount of electric flux entering the gallery 260 because of the gap created by slit 232 in the outer conductor 230. Second, a differential signal may be used as the output signal in order to further reduce the impact of the fraction of the electric field that could penetrate into the cavity despite the outer conductor 230. Ideally, the differential voltage between the two terminals 244 of the current sensor is roughly proportional to the oscillating magnetic field, in accordance with the theory of electromagnetism. But, because of the presence of the slit 232, a weak electric field inside the gallery 260 may get capacitively coupled to the current pickup 241. However, the current pickup 241, slit 232, and gallery 260 may be constructed to be mirror symmetric about a plane which passes through the center of the slit 232 and is oriented perpendicular to the longitudinal axis of the RF pipe. Because of this geometrical mirror symmetry of the half-loop current pickup 241 mentioned above, the perturbations along the vertical branches 242 and on the electric potentials appearing at the two terminals 244 are roughly equal in magnitude and phase. This symmetry property may be used advantageously because it implies that the differential signal is immune to the parasitic signals in the current pickup 241 due to interaction with the penetrating electric field in the gallery 260. In other words, the potential difference between the first terminal and the second terminal of the terminal pair 244 remains unperturbed, correct to first order precision. These aspects of the current sensor 240 design may be used advantageously to achieve measurements of current with high precision, particularly in applications such as providing an RF bias signal to an electrostatic substrate holder in a plasma chamber, wherein the load impedance may be such that the amplitude of the electric field is relatively high and the amplitude of the magnetic field is relatively low close to the point where the RF signal enters the plasma chamber.

Still referring to FIG. 2B, the ring-shaped conductor placed inside the outer conductor 230 close to its inner surface is the voltage pickup 251 of the voltage sensor 250. The strength of the signal generated by the voltage pickup 251 may depend on its dimensions. While the diameter may be roughly determined by the diameter of the outer conductor 230, the width and thickness are adjustable design parameters. The conductive voltage pickup 251 in this embodiment is a ring electrically connected at one point to the third terminal 253 (e.g., a coaxial cable connector) of the V-I sensor 200. The conductive voltage pickup 251 is insulated from the conductive outer conductor 230 by a ring-shaped dielectric component 252 attached to the voltage pickup 251.

As explained above, the voltage pickup 251 provides an electrical signal at the third terminal 253 of the V-I sensor 200 resulting from charge polarization induced by the RF electromagnetic field. The electric potential at the third terminal 253 is reflective of the oscillating voltage of the inner conductor (not shown in FIG. 2B for clarity). The RF electric field gets capacitively coupled to the voltage pickup 251. However, the interaction with the magnetic field is negligible because the longitudinal axis is normal to the plane of the ring, as explained above with reference to FIG. 1B.

The ring-shaped design of the voltage pickup 251 uses axial symmetry to reduce the sensitivity of the output of the voltage sensor 250 to some of the placement and sizing errors, as explained herein. First, the circular symmetry may remove the need for precise placement of the voltage pickup 251 because, to first order precision, the electric potential at the conductive surface of the ring is independent of the offset in the location of the ring's center from the central axis (axis 2B-2B' in FIG. 2A and LA1 in FIG. 1B). Rather, the potential of the voltage pickup 251 depends primarily on the dimensions of the ring (e.g., the inner diameter, outer diameter, and thickness). In contrast, in an asymmetrical voltage pickup design, the voltage pickup conductor would acquire an electric potential that, to first order precision, depends on the size as well as the placement of the asymmetrical voltage pickup. For example, a mushroom-shaped voltage pickup may be sensitive not only to the dimensions of the conductive surface at the mushroom head but also to its position relative to the inner conductor. In such designs, the distance between the voltage pickup and the longitudinal axis of the RF pipe may have to be adjusted precisely during assembly, sometimes manually using a micrometer screw gauge. Second, the design of the voltage pickup 251 may roughly cancel out any centering error during assembly of the voltage sensor 250 into the V-I sensor 200. Axial symmetry of the voltage pickup 251 ensures that, to first order precision, the total electric flux is unaltered even if the center of the circle of the voltage pickup 251 is slightly displaced from the longitudinal axis of the inner conductor. The increase in electric flux in one half of the ring that may be displaced closer to the inner conductor is balanced by a concomitant decrease in the electric flux in the other half of the conductive ring that would now be further from the longitudinal axis because of the circular geometry of a ring.

Figure 3:
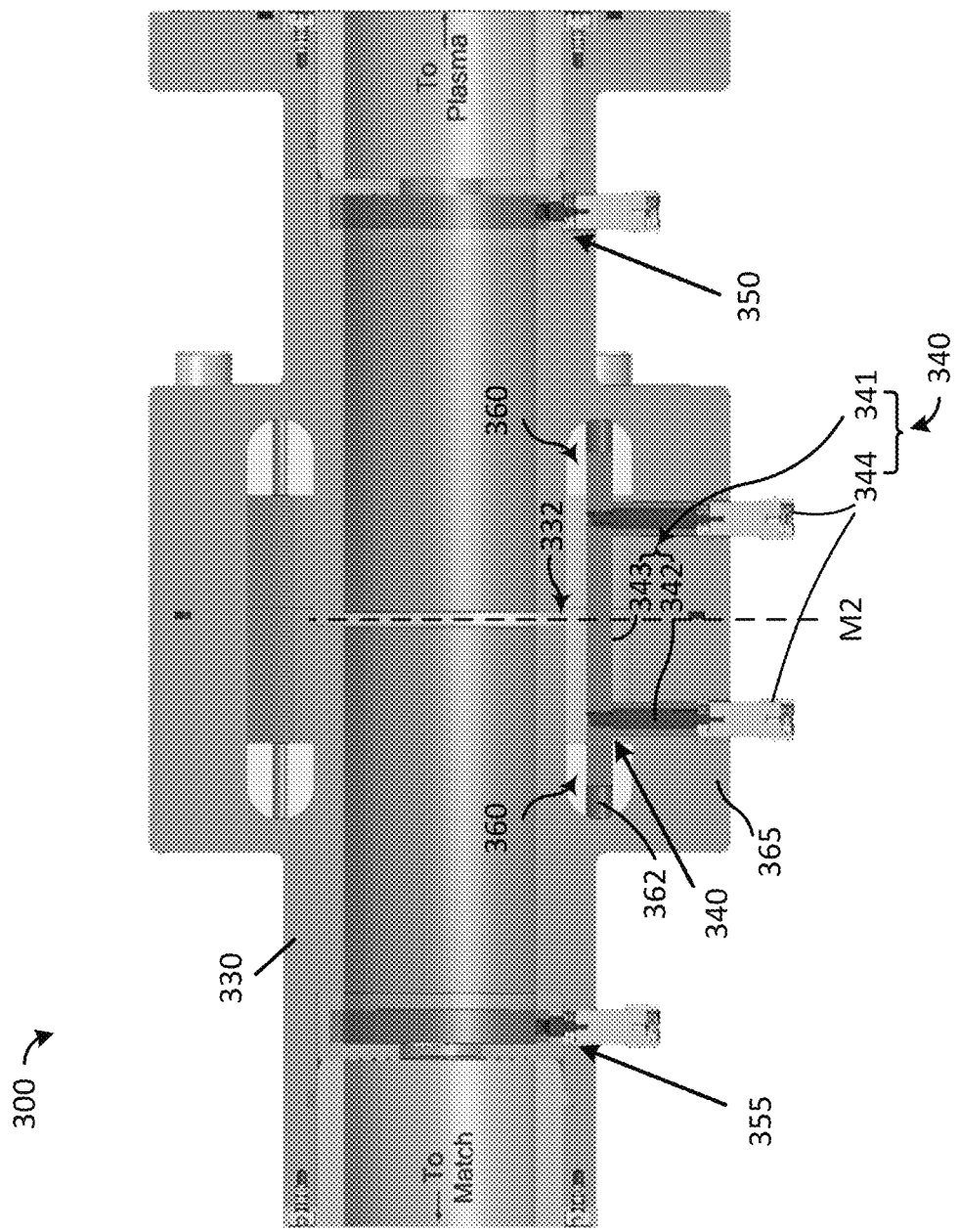
FIG. 3 illustrates a cutaway diagram of a V-I sensor for an RF pipe, in accordance with some embodiment.

FIG. 3 illustrates a cutaway view of another embodiment of a V-I sensor 300 having a current sensor 340 located in a gallery 360 inside a sensor casing 365. The horizontal branch 343 is shown supported by insulating parts 362 and connected to the two vertical branches 342 of the current sensor 340. A slit 332 going around in the plane of mirror symmetry M2 is seen above the horizontal branch 343.

A first voltage sensor 350 is shown inside an outer conductor 330, similar to the V-I sensor 200 described with reference to FIGS. 2A and 2B. In addition, the V-I sensor 300 has a second voltage sensor 355 located symmetrically on the opposite side of the current sensor 340. In this embodiment, the voltage pickup and housing of the first and second voltage sensors 350 and 355 have been recessed into the body of the outer conductor 330 in order to keep the inside surface of the outer conductor 330 as smooth as possible. The smooth inner surface of the outer conductor 330 provides the advantage of reducing the perturbation to the electromagnetic fields caused by inserting the voltage sensors 350 and 355. In this embodiment, the V-I sensor 300 causes negligible perturbation to the electromagnetic fields in the RF pipe.

The measurements from the first voltage sensor 350 and the current sensor 340 have a relative phase error because of the difference in measurement locations between them. In this embodiment, an oppositely placed second voltage sensor 355 has an opposite phase error because of this symmetric location relative to the current sensor 340 (i.e., the plane of mirror symmetry M2 of the current sensor 340 is equidistant from first voltage sensor 350 and the second voltage sensor 355). From symmetry, the error in the relative phase between voltage and current in the RF signal waveform sensed by the first voltage sensor 350 and the respective error in the RF signal waveform sensed by the second voltage sensor 355 cancels out in the sum of the two sensed voltage signals, at least to first order precision. Accordingly, a more accurate voltage measurement may be provided by combining the signals from the first and second voltage sensors 350 and 355. By using, e.g., the arithmetic mean of the measurements from the first voltage sensor 350 and the second voltage sensor 355, the phase error may be reduced or even eliminated to yield a voltage measurement reflective of the voltage at the plane of mirror symmetry.

In addition, the presence of the second voltage sensor 355 helps ensure that the two vertical branches 342, as well as the left half and right half of the horizontal branch 343 of the current pickup 341 experience the same electric and magnetic fields. As explained above, parasitic electrical signals may be generated by unwanted coupling of the current pickup to the electric field penetrating into the cavity in the gallery 360. By improving the geometrical symmetry, the second voltage sensor 355 helps ensure that the perturbations in the electric potentials seen at the first and second terminals 344 of the current sensor 340 get cancelled out more accurately by using the differential current measurement, as described above with reference to FIGS. 2A and 2B. In some embodiments, it may be optional to use the output of the second voltage sensor 355.

Figure 4:
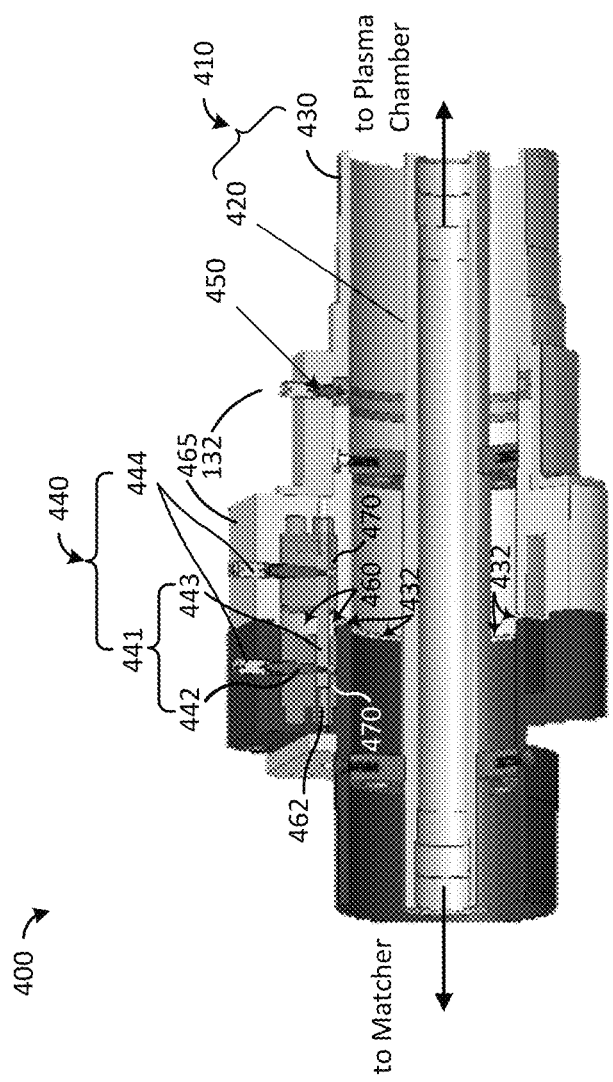
FIG. 4 illustrates a cutaway diagram of a V-I sensor for an RF pipe, in accordance with some embodiment.

FIG. 4 illustrates yet another embodiment of a V-I sensor 400 attached to an RF pipe 410 comprising an inner conductor 420 and an outer conductor 430.

The V-I sensor 400 comprises a current sensor 440 and a voltage sensor 450 placed in a gallery 460, similar to the V-I sensor 200 described with reference to FIGS. 2A and 2B. The design of the V-I sensor 400 has been improved relative to the design of the V-I sensor 200 (see FIGS. 2A and 2B) by providing additional mechanical support to the horizontal conductor 443 of the current pickup 441 of the current sensor 440.

In the design of the V-I sensor 400, illustrated in FIG. 4, the supporting components (e.g., plastic parts 462 and 470) may fix the horizontal branch 443 more robustly than the respective parts (e.g., plastic parts 262) in the V-I sensor 200, illustrated in FIG. 2B. For example, in one embodiment, the plastic parts 262 at the two ends of the horizontal branch 243 in V-I sensor 200 are rings with a set of holes into which the horizontal branch 243 may be placed, whereas, in the design of the V-I sensor 400, the plastic parts, such as the parts 462 and 470, encompass more of the horizontal branch 443, and may have bosses which fit tightly into matching cavities in the metal sensor casing 465 and metallic outer surface of the outer conductor 430.

As illustrated in FIG. 4, supporting structures 470 (e.g., made of plastic or other non-conductive materials), placed in addition to the insulating supports 462, hold the conductive horizontal branch 443 of the current pickup 441 from all sides. The supporting structures 470 include a first portion for supporting a first part of the horizontal branch and a second portion for supporting a second part of the horizontal branch and are separated by a gap. In contrast, as illustrated in FIG. 2B, the plastic parts 262 (similar to the supports 462) do not support the horizontal branch from below. In FIG. 2B, there is empty space between the horizontal branch 243 of the current pickup 241 of the current sensor 240 and the outer conductor 230. The extra support prevents the horizontal conductor 443 from bending when the vertical branches 442 of the current pickup 441 are placed in contact with the horizontal branch 443. In addition, the supporting structures 470 may prevent over tightening of the vertical branches 442 to the horizontal branch 443. The variations in the magnetic flux coupled to the current pickup 441 are influenced by the variations in the shape and area of the half-loop geometry of the current pickup 441. Hence, stabilizing the shape of the current pickup 441 reduces variations in the electrical output of the current sensor 440 and improves the precision of the measurement of current.

Figure 5:
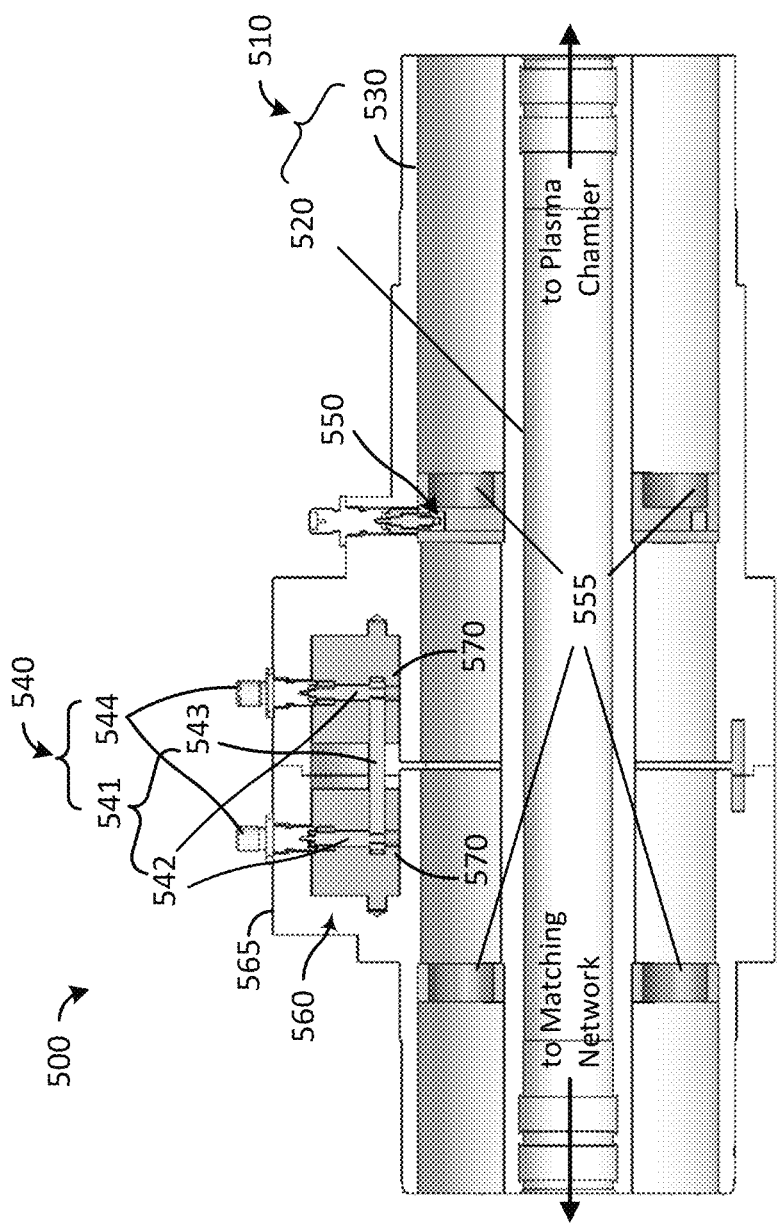
FIG. 5 illustrates a cutaway diagram of a V-I sensor for an RF pipe, in accordance with some embodiment.

FIG. 5 illustrates a V-I sensor 500 attached to an RF pipe 510 comprising an inner conductor 520 and an outer conductor 530. A current sensor 540 is shown having a pair of terminals 544 disposed over the sensor casing 565 and a single-turn half-loop current pickup 541 disposed inside a gallery 560. The current pickup 541 comprises two vertical branches 542 attached to a horizontal branch 543. Similar to the V-I sensor 400 in FIG. 4, the plastic parts 570 have been used to prevent over tightening of the vertical branches 542 and bending of the horizontal branch 543 of the current pickup 541 during assembly of the current sensor 540.

The V-I sensor 500 includes improvements that reduce the machining complexity, thereby reducing manufacturing cost relative to the V-I sensor 400 (shown in FIG. 4). The design of V-I sensor 500 has been improved over that for V-I sensor 400 by using a voltage sensor 550 in which the insulator pieces 555 which center the inner conductor 520 of the RF pipe 510 are also used to support the conductive voltage pickup ring of the voltage sensor 550, as illustrated in FIG. 5. Using the same plastic parts 555 for multiple purposes allows elimination of some of the plastic parts used, e.g., in the V-I sensor 400. This reduces the machining complexity and manufacturing cost for the V-I sensor 500.

The conductive voltage pickup ring of the voltage sensor 550 in FIG. 5 has been positioned closer to the inner conductor 520 by designing the diameter of the voltage pickup ring to be smaller than the diameter of the outer conductor 530. The smaller diameter of the voltage pickup ring increases the output signal strength of the voltage sensor 550, as explained above with reference to FIGS. 1B and 1C.

Although a single turn half-loop current pickup has been used in the V-I sensors described above with reference to FIGS. 1-5, it is understood that multiple turns may also be utilized in the design of a current pickup of the current sensor. For example, the current pickup in the V-I sensors illustrated in FIGS. 1-5 may comprise a plurality of rectangular turns between the two ends of the current pickup connected to the two terminals of the current sensor. As mentioned above, multi-turn current pickups may also be constructed by winding a conductive wire around a mandrel, for example, a toroidal mandrel. The conductive wire may be wound in a coil about the circular axis of a doughnut shaped insulating material that circles symmetrically around the inner conductor of an RF pipe that passes perpendicularly through the central hole of the toroid. Multi-turn current pickups using a toroidal mandrel are described below with reference to FIGS. 6A-7E.

It is understood that the mandrel may not conform exactly to the mathematical definition of toroid, but that it is generally shaped like a toroid with structures to attach a coil, make connections to terminals, and the like.

Figure 6A:
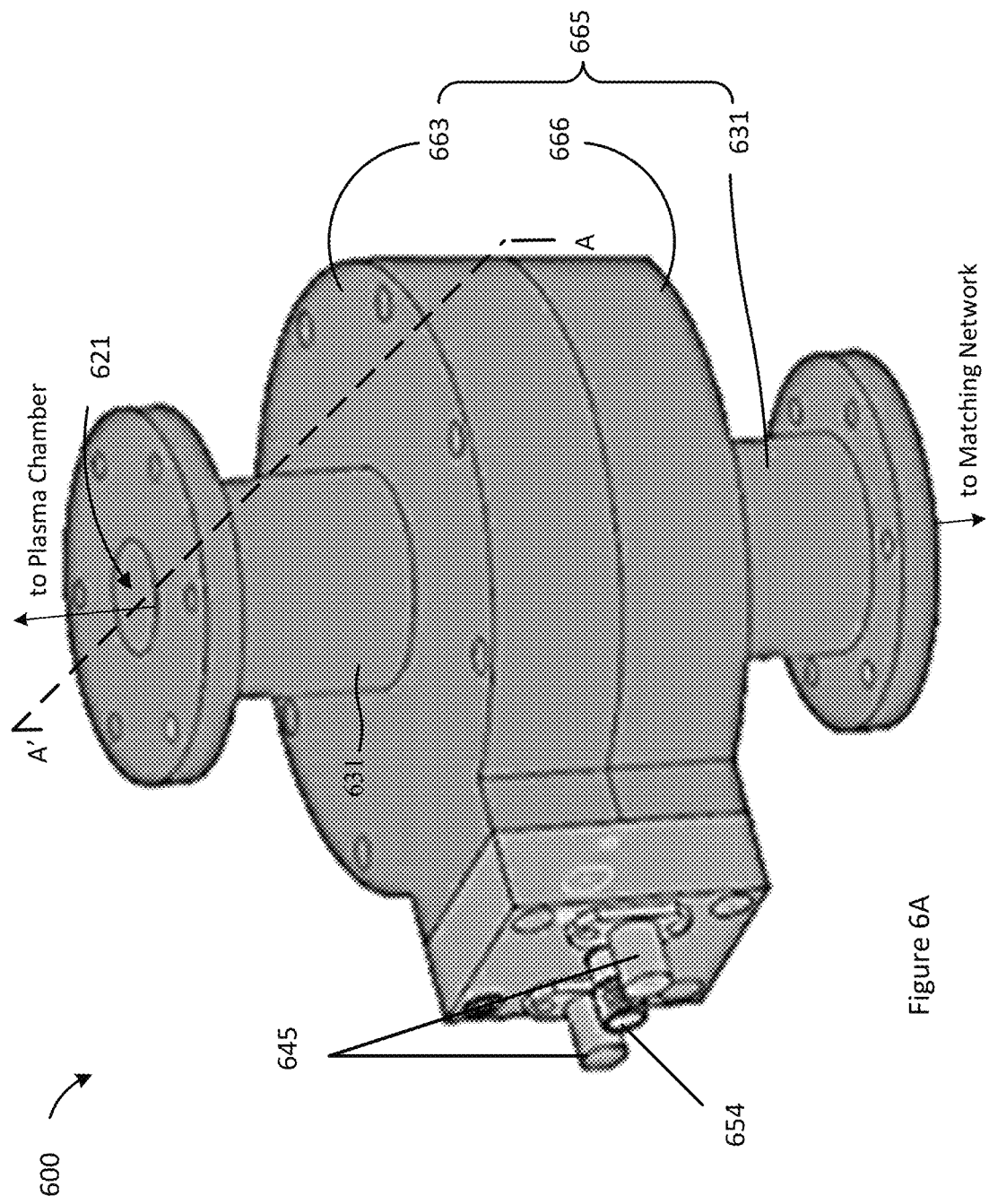
FIG. 6A illustrates a perspective view of a V-I sensor for an RF pipe, in accordance with some embodiment.
Figure 6C:
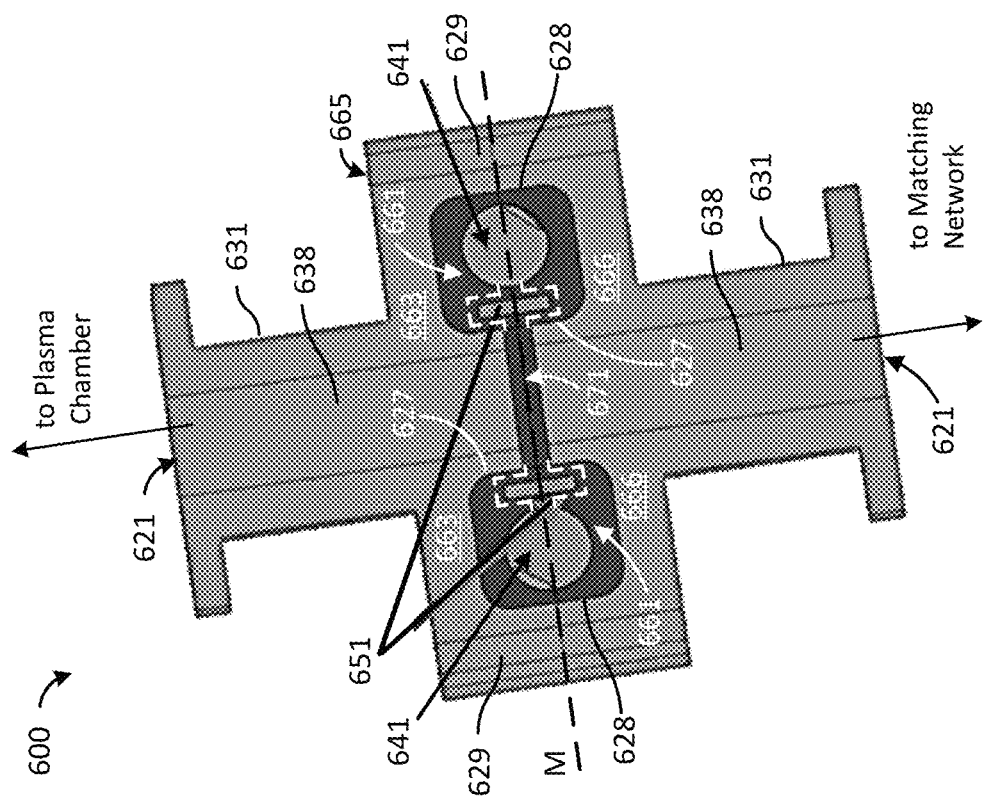
FIG. 6C illustrates a cross-sectional view of the V-I sensor illustrated in FIG. 6A.
Figure 6B:
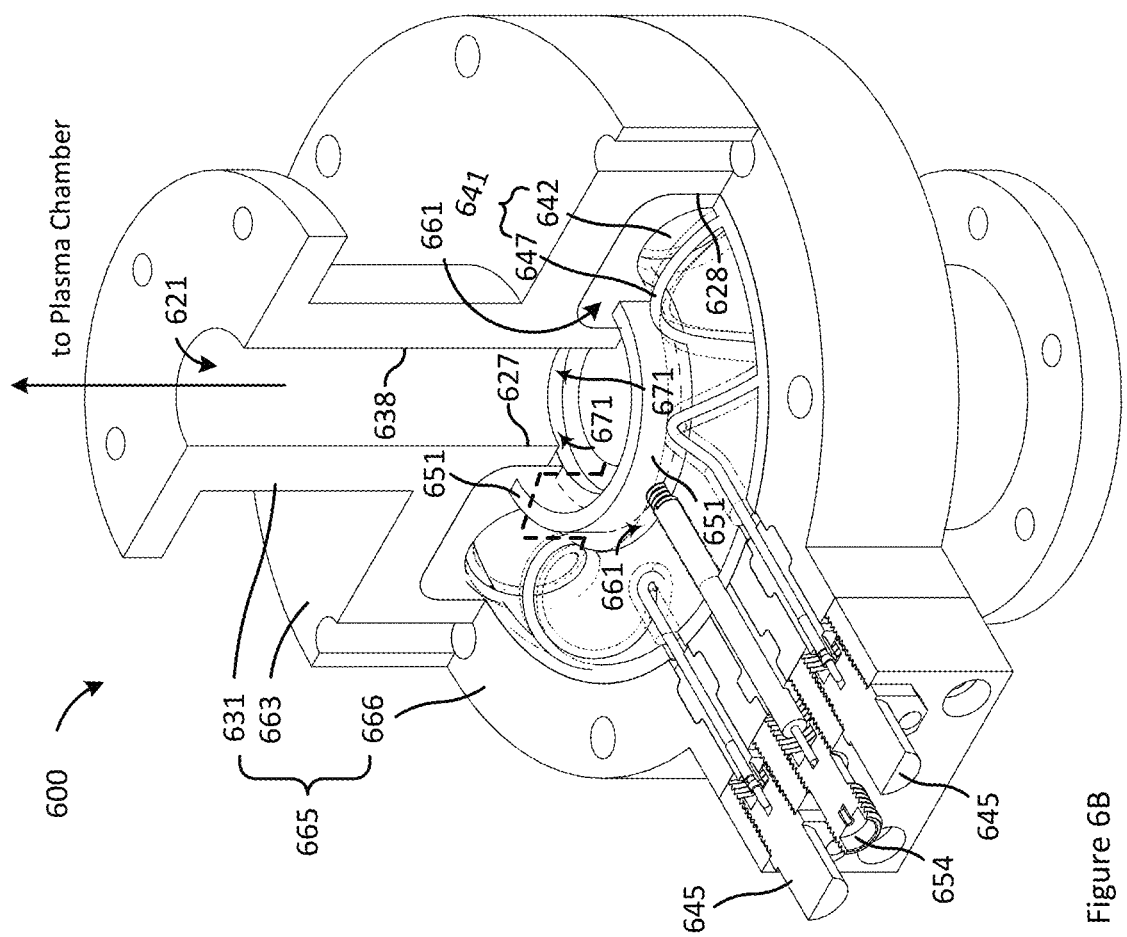
FIG. 6B illustrates a cutaway diagram of the V-I sensor illustrated in FIG. 6A.

FIG. 6A illustrates a perspective view of a V-I sensor 600, FIG. 6B illustrates a cutaway view, and FIG. 6C illustrates a cross-sectional view along an axis A-A' of the V-I sensor 600.

FIG. 6A shows a conductive sensor casing 665 of the V-I sensor 600. The current and voltage pickups, not visible in FIG. 6A, are housed within a space enclosed by the conductive sensor casing 665. In FIGS. 6A-6C the inner conductor would pass through a central hole 621. The inner conductor itself is omitted from the various views of the V-I sensor 600 in FIGS. 6A-6C for clarity. The outer conductor of the RF pipe would connect to flanges at the top and the bottom of the conductive sensor casing 665. Two neck regions 631 are shown adjacent to the flanges at the top and bottom portions of the sensor casing 665 in FIG. 6A. The shape and dimension of the neck region 631 may be designed to be of similar to that of the outer conductor of the RF-pipe. The sensor casing 665 may thus be construed as an extension of the outer conductor that expand from the neck regions 631 into a wider central portion comprising a top cover 663 and a bottom cover 666 having conductive walls of a larger diameter. The sensor casing 665 and the outer conductor form the outer shield of the coaxial structure and may be connected to ground. As described below with reference to FIGS. 6B and 6C, the wider central portion of the sensor casing 665 accommodates an annular dielectric cavity 661 around the inner conductor passing through the central hole 621.

The perspective view in FIG. 6A also shows three coaxial cable connectors assembled outside the sensor casing 665. The three coaxial cable connectors are three terminals of the V-I sensor 600. The outside pair of coaxial connectors 645 connects to the terminals of the current sensor 641, connected to the current pickup, and the coaxial connector in the middle connects to the center terminal 654, connected to the voltage pickup 651 of the voltage sensor. The current and voltage pickups are located between the top cover 663 and bottom cover 666.

The cutaway diagram in FIG. 6B and the cross-sectional view in FIG. 6C along a cutting plane A-A' (shown in FIG. 6A) illustrate the internal structure of the V-I sensor 600. The inner conductor of the RF pipe is omitted for clarity. The inner surface 638 of the central hole 621, as shown inside the neck region 631 in FIGS. 6B and 6C, forms the sidewall inside the main coaxial structure which may be construed as the RF pipe. The neck region 631 expands into the wider diameter top and bottom covers 663 and 666 of the sensor casing 665 enclosing the dielectric cavity 661 in a section around the central hole 621 of the V-I sensor assembly 600. The inner wall 638 continues as the surface 627 of the top and bottom covers 663 and 666 till it is interrupted by the slit 671. As illustrated in FIG. 6C, the dielectric cavity 661 is between a first major outer surface 627 and a second major outer surface 628 along a radial direction from a cent erof the central hole 621. The first major outer surface 627 comprises a continuously circular ring shaped region in physical contact with the central hole 621. Vertically, the ring shaped first major outer surface 627 is separated into two parts by the slit region 671. The second major outer surface 628 is located at a radial distance greater than a radius of the first major outer surface 627.

The cavity 661 includes a slit region 671. As illustrated in FIGS. 6B and 6C, the slit region 671 comprises a physical break in the inner surface 627 of the cylindrical wall of the central hole 621 that forms a gap in the juncture between the top and bottom covers 663 and 666 of the sensor casing 665. Surface 627 is an extension of surface 638 of the cylindrical wall of the central hole 621. When viewed radially from the center of the central hole 621, the slit region 671 has the appearance of an insulating ring in physical contact with the central hole 621. Further radially outwards, the slit region 671 takes a zig-zag shape that circumvents the ring-shaped conductive voltage pickup 651, as indicated by zig-zag dashed lines in FIGS. 6B and 6C. The continuous insulating annular region of cavity 661 radially disposed between the physical contact with the central hole 621 and the inner radius of the toroidal current sensor 641 is referred to as the slit region 671 of the V-I sensor 600. As illustrated in FIGS. 6B and 6C, the slit region 671 forms a dielectric barrier interposed between the conductive voltage pickup 651 and the current sensor 641, as well as the sensor casing 665. In the region radially between the first major outer surface 627 and second major outer surface 628, the cavity 661 (which includes the insulating slit region 671) electrically isolates the top cover 663 and the bottom cover 666. For radial distances smaller than the first major outer surface 627, the top cover 663 is electrically isolated from the bottom cover 666 by the central hole 621. The top cover 663 is electrically coupled to the bottom cover 666 through a coupling region 629 radially beyond the second major outer surface 628 of the dielectric cavity 661.

With this design, almost none of the RF current flowing in the grounded sensor casing 665 may flow in the region surrounded by the toroidal current sensor 641. The current would flow vertically in the neck region 631 along the inner wall 638 and then be routed around the current sensor 641 because of the physical break in the inner surface 638 created by the dielectric slit 671. On account of the slit 671, the current would be diverted radially outwards around the toroidal current sensor 641, flowing laterally along the conductive walls of the annular dielectric cavity 661, return back in radially, and then continue vertically along the inner wall 638 of the neck region 631.

Referring to FIGS. 6B and 6C, the current sensor 641 is the toroidal structure inside the annular dielectric cavity 661, in the outer portion of the cavity, i.e., the region farther from the central hole 621. The current sensor 641 comprises a conductive coil 647 and a toroidal mandrel 642. The coil 647 comprises a plurality of turns of a continuous conductive wire wound around the central circular axis of the toroidal mandrel 642. The two opposite ends of the coil 647 may be attached to the coaxial connectors 645, as illustrated in FIG. 6B. The conductive wire of coil 647 may be a bare conductor, an enameled conductor, or a conductor coated with an insulator. The toroidal mandrel 642 is described in further detail below with reference to FIG. 6D. The current sensor 641 is electrically insulated from the conductive sensor casing 665.

As illustrated in FIGS. 6B and 6C, the conductive voltage pickup 651 of the voltage sensor is shaped like a conductive ring. The voltage pickup 651 is shown disposed in the region of the annular dielectric cavity 661 between the toroidal current sensor 641 and the central hole 621. Solid dielectric material (e.g., plastic) may be used for parts used to provide mechanical support for the voltage pickup 651. The slit region 671 of the cavity 661 and the dielectric supporting parts electrically isolate the conductive voltage pickup 651 from the conductive sensor casing 665. The connection between the voltage pickup 651 and the center terminal 654 is illustrated in FIG. 6B. (The coaxial connectors 645 and the center terminal 654 are not included in the cutting plane A-A'; hence not visible in the cross-sectional view shown in FIG. 6C.)

The function of the voltage pickup 651 is to sense the RF voltage of the inner conductor at the center of the central hole by sensing a radial electric field between the inner conductor and the outer conductor of the RF pipe. Generally, the outer conductor of the RF pipe and the conductive sensor casing 665 are grounded. Accordingly, the voltage pickup 651 may not be able to function properly if the conductive ring of the voltage pickup 651 gets shielded from the inner conductor of the RF pipe by, for example, a grounded metal ring placed in the annular dielectric region between the inner conductor and the voltage pickup 651. With excessive shielding the voltage sensor output would be too weak to be usable. As illustrated in FIGS. 6B and 6C, the voltage pickup 651 extends vertically partially into the annular dielectric cavity 661 above and below the slit region 671 of the cavity 661. The cavity is formed by the groove of the metal top cover 663 above and the respective groove in the metal bottom cover 666 below. While the grounded conductive inner walls of these grooves interpose between the conductive ring of the voltage pickup 651 and the central axis of the central hole 621 for the inner conductor, the grounded metal does not completely shield the voltage pickup 651. There is a dielectric slit 671 separating the top cover 663 from the bottom cover 666, illustrated in FIGS. 6B and 6C. The slit 671 is seen as the dielectric region shaped like a cylindrical disk in the mirror plane M (indicated by a dashed line in FIG. 6C) because there is no inner conductor present in the central hole 621. When the inner conductor would be in place, the dielectric slit 671 would be shaped like an annular disk around the inner conductor. The unshielded radial electric field in the dielectric slit 671 would be sensed by capacitive coupling between the inner conductor and the central portion of the ring-shaped voltage pickup 651. The voltage pickup 651 may now provide a usable electrical signal proportional to the RF voltage of the inner conductor at that location.

The function of the current pickup coil 647 is to sense the RF current in the inner conductor at the center of the central hole by sensing a circulating magnetic field threading through the coil in a direction parallel to the circular central axis of the toroidal mandrel 642. By Faraday's Law, an oscillating electrical signal is induced in the coil, proportional to the oscillating magnetic flux in the toroidal mandrel 642 enclosed within the turns of the conductive wire of coil 647. According to Ampere's Law, the strength of the magnetic field threading through the current sensor 641 is proportional to the total current crossing the area of the plane enclosed within the central hole of the toroidal current sensor (analogous to the doughnut hole of a doughnut). As is true for any coaxial structure, the current through the inner conductor at any location of an RF pipe is exactly equal to an opposite current in the outer conductor. The sensor casing 665 of the V-I sensor 600 may be considered to be the equivalent outer conductor of the RF pipe, where the inner conductor is passing through the central hole 621. Accordingly, the current sensor 641 may not function properly unless the RF current in the sensor casing 665 is constrained to flow outside of the circular disk shaped region enclosed by the outer circumference of the toroidal mandrel 642. For example, if the top cover 663 and the bottom cover 666 come in electrical contact at a radial distance from the central axis that is shorter than the inner radius of the toroidal mandrel 642 then a fraction of the current in the conductive casing may flow through that contact. This current being opposite to the current in the inner conductor, would diminish the magnitude of the total current enclosed by the current sensor 641, hence diminish the magnetic flux threading through the coil 647. If the total current through the contact inside the area enclosed by the toroidal current sensor 641 is too low then the magnetic field may be insufficient to induce a usable electrical signal in the current pickup coil 647. Again, the dielectric slit region 671 prevents electrical contact between the top cover 663 and the bottom cover 666 at radial distances smaller than the inner radius of the toroidal current sensor 641, as illustrated in FIGS. 6B and 6C.

An uninterrupted, continuous dielectric region separating the top cover 663 and the bottom cover 666 all the way to the outer circle of the toroidal current sensor 641 is achieved by designing the voltage pickup 651 to be smaller than the vertical height of the cavity 661. The conductive ring of the voltage pickup 651 may be positioned roughly symmetrically between the top cover 663 and the bottom cover 666 by supporting parts comprising insulating materials. Accordingly, in all directions, the immediate vicinity of the conductive voltage pickup 651 is insulating material. As described above, this insulating material is within the slit region 671 of the cavity 661. The shape of the dielectric above the conductive ring of the voltage pickup 651 is delineated by a zig-zag dashed line FIG. 6B. It may be noted that, as illustrated by the dashed lines in FIG. 6C, the zig-zag dielectric slit region 671 is present both above and below the voltage pickup 651 because the conductive ring of the voltage pickup 651 has to be electrically isolated from the grounded sensor casing 665.

The current pickups of the current sensors are generally shielded from the RF electric field by grounded conductive parts. Shielding the current pickup is advantageous in applications where the electric field is strong and the magnetic field is weak, such as close to a high impedance load. In V-I sensor 600, the current pickup coil 647 is located in the dielectric cavity 661 inside the sensor casing 665. The conductive parts encountered while moving radially inward from the toroidal current sensor 641 to the inner conductor include first, the conductive voltage pickup 651 and second, a portion of the inner wall of the conductive sensor casing 665, as seen in FIGS. 6B and 6C and also described above. These interposing conductive parts may help shield the current sensor 641 from the radial electric field. Some of the electric field lines emanating from the inner conductor may terminate on the grounded inner wall of the conductive sensor casing 665. In addition, the conductive voltage pickup 651 serves a dual purpose by partially shielding the coil 647 from the RF electric field. Since the voltage pickup 651 is not shorted to ground, the reduction in the electric field provided by the conductive ring depends on the magnitude of the impedance to ground at the center terminal 654.

The structures of both the current sensor 641 and voltage pickup 651 of V-I sensor 600 are axisymmetric relative to a shared axis passing through the center and in a direction normal to the plane of the central hole 621. Furthermore, both the current sensor 641 and voltage pickup 651 share the same minor plane (indicated by a dashed line M in FIG. 6C) perpendicular to the longitudinal axis. The symmetry of the structure of V-I sensor 600 helps reduce/eliminate any discrepancy in the measurement of the phase angle (Θ) between voltage and current. Furthermore, first order cancellation effects due to axisymmetry make the sensor output signals of V-I sensor 600 less sensitive to machining tolerances and to positioning errors during assembly.

FIG. 6D illustrates an example toroidal structure that may be used as the mandrel 642 of the toroidal current sensor 641 shown in FIG. 6B. The toroidal mandrel 642 has a continuous groove on its outer surface in which a conductive wire may be placed to form the coil 647 (shown in FIG. 6B). The two opposite ends of the coil 647 may be threaded through two openings 643, illustrated in FIG. 6D, and subsequently attached to the pair of coaxial connectors 645 (see FIG. 6B). The voltage pickup 651 (see FIG. 6B) may be connected by a conductive element threaded through a hole in the toroidal mandrel 642 and the opening 653 to be attached to the center terminal 654.

The toroidal mandrel 642 comprises plastic and other insulating materials and may be fabricated using, for example, 3D printing technology. After the coil 647 has been mounted on the grooved toroidal mandrel 642, the structure may optionally be encased in a coating of resin using, for example, an embedded-resin technique. The resin encapsulation firmly fixes the coiled multi-turn current pickup 647.

The integrated assembly of the V-I sensor 600, described above, comprising the current sensor 641 and the combined electric-field shield and a voltage pickup 651 provides the advantage of a compact V-I sensor design.

FIGS. 7A through 7E illustrate a current sensor assembly 701, similar in design to that of V-I sensor 600. Unlike the V-I sensor 600, the current sensor assembly 701 does not sense voltage. Also, the design of the toroidal mandrel 742 used for the current sensor assembly 701 is different from the grooved toroidal mandrel 642, as described further below.

Figure 7A:
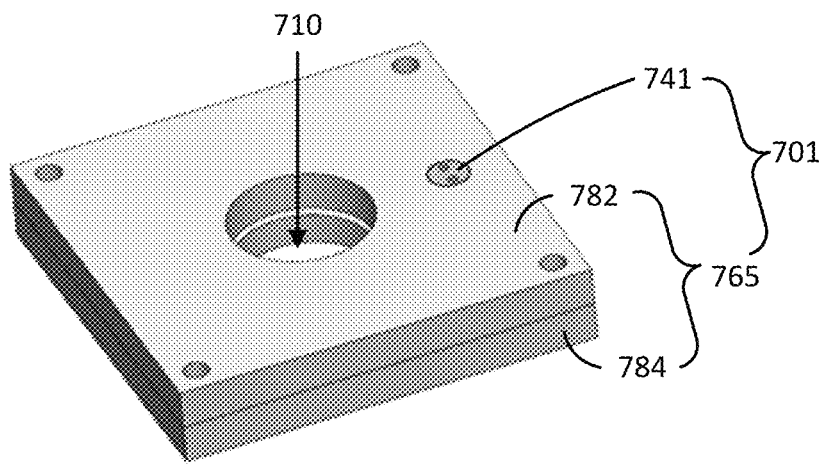
FIG. 7A illustrates a perspective view of a current sensor assembly for an RF pipe, in accordance with some embodiment.

FIG. 7A illustrates a perspective view of a current sensor assembly 701 using a toroidal current sensor 741 placed in a dielectric cavity between a top cover 782 and a bottom cover 784 of the sensor casing 765. The current sensor 741 is described further below with reference to FIGS. 7C-7E. The top and bottom covers 782 and 784 may comprise a metal (e.g., copper or aluminum). The current sensor assembly 701 has a central hole 710. The inner conductor of a coaxial transmission line (e.g., a RF pipe) for which the current sensor assembly 701 may be used would be passing through the central hole 710. The current sensor assembly 701 would be thereby positioned symmetrically about a longitudinal axis of the coaxial transmission line.

Figure 7B:
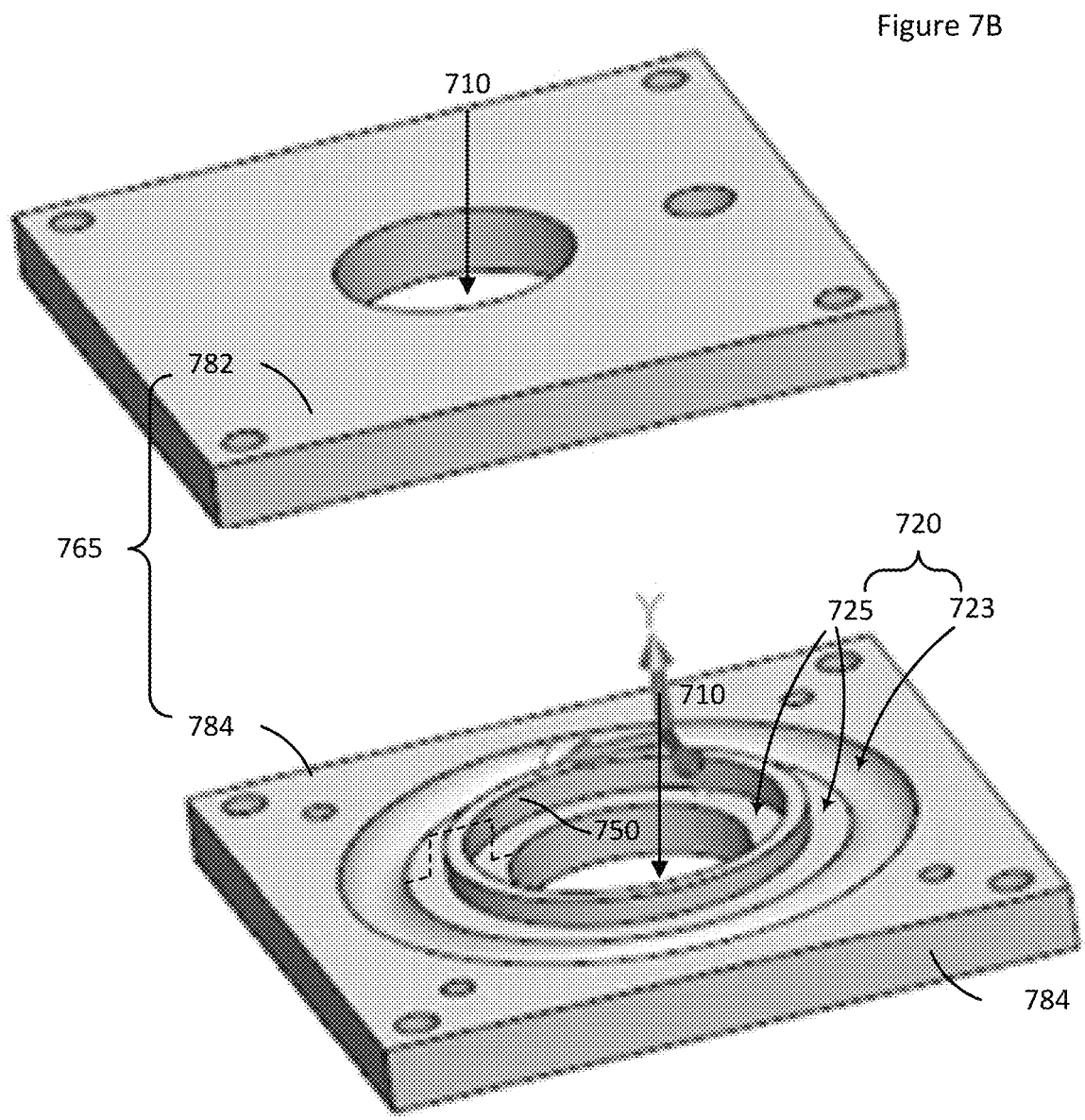
FIG. 7B illustrates an exploded view of the current sensor assembly illustrated in FIG. 7A.

FIG. 7B illustrates an exploded view of the current sensor assembly 701. In FIG. 7B, the current sensor 741 has been removed from of the sensor casing 765 to show the structure of the bottom half of the dielectric cavity 720 and the bottom cover 784. (The top half of the structure is described further below with reference to FIG. 7C.) The dielectric cavity 720 may be partitioned into an outer dielectric region 723 and an inner dielectric region, referred to as the zig-zag dielectric slit 725. The outer dielectric region is the region above the outermost groove in the floor of the bottom cover 784. Outside the outer circle of this outermost groove, the metal top cover 782 and the metal bottom cover 784 may be connected together physically and electrically, but no electrical contact may be made between the top cover 782 and the bottom cover 784 inside the outer circle of the outermost groove.

The zig-zag dielectric slit 725 comprises the dielectric region over the two grooves on either side of a conductive ridge 750 shaped like a ring protruding from the floor of the bottom cover 784. The conductive floor of the dielectric cavity 720, including the conductive ridge 750 would be electrically and physically separated from the respective conductive roof of the dielectric cavity 720 by an unbroken continuous dielectric region. Accordingly, the top of the conductive ridge 750 may protrude into a respective groove in the top metal cover 782 but may not make contact with the roof. The combined top and bottom portions of the zig-zag dielectric slit 725 would thus be a zig-zag shaped dielectric region going around and over the conductive ridge 750, as indicated by a zig-zag dashed line in FIG. 7B.

Figure 7C:
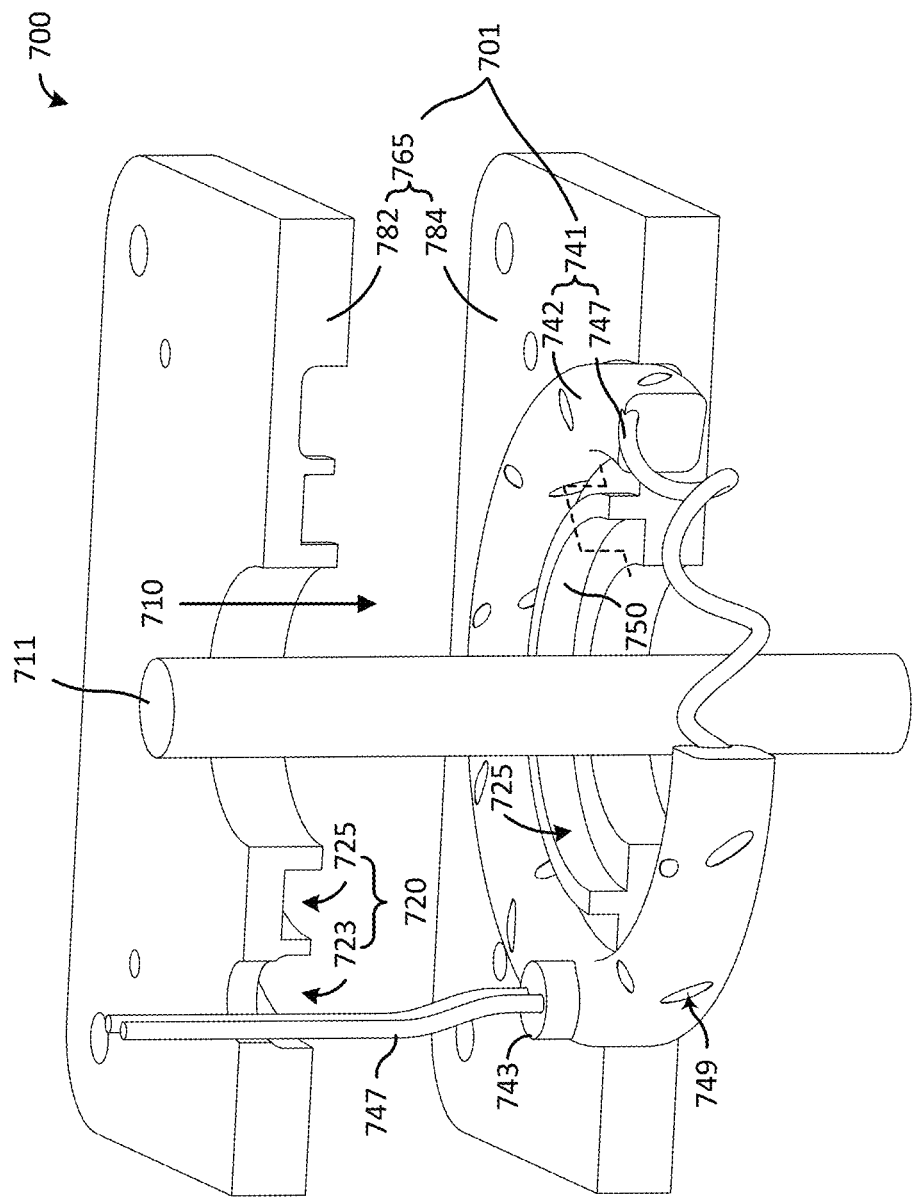
FIG. 7C illustrates an exploded view of a cutaway diagram of the current sensor assembly of FIG. 7A, along with an RF conductor for an RF pipe.

FIG. 7C illustrates a portion of an RF system 700 comprising an inner conductor 711 of an RF pipe passing through the central hole 710 of the current sensor assembly 701 positioned symmetrically around the inner conductor 711. The grounded outer conductor would be attached physically and electrically to the top cover 782 from above and the bottom cover 784 from below, thereby grounding the sensor casing 765. The sensor casing would act as the grounded outer conductor for the portion of the inner conductor 711 passing through the central hole 710, similar to the sensor casing 665 of the V-I sensor 600.

In FIG. 7C, the current sensor assembly 701 is illustrated by a cutaway diagram of an exploded view that includes the current sensor 741. The current sensor 741 comprises the toroidal mandrel 742, along with the conductive current pickup coil 747. The toroidal mandrel 742 comprises a solid dielectric material with a winding passage. The winding passage may be accessed through access holes 749 at various locations on the surface of the toroidal mandrel 742. An attachment 743 having two holes has been placed over one of the access holes 749. The two opposite ends of the conducting wire of the coil 747 are shown protruding upward through the holes in the attachment 743. A portion of the toroidal mandrel 742 has been cut out to show the conducting wire of the coil 747 tunneling through the winding passage in the solid dielectric material of the toroidal mandrel 742. The coil 747 is inlaid inside the mandrel 742. The design of mandrel 742 provides greater mechanical support relative to the grooved design of mandrel 642, thereby eliminating the resin encapsulation step described earlier with reference to FIG. 6D.

In FIG. 7C, the toroidal mandrel 742 has been placed in the outer dielectric region 723 and the respective groove on the floor of the bottom cover 784 (see FIG. 7B). The exploded view of the current sensor assembly 701 illustrates that the top half of the toroidal mandrel 742 may fit into a groove in the top cover 782 in the outer dielectric region 723 of the dielectric cavity 720. The conductive ridge 750 may likewise extend into an adjacent groove in the top cover 782 in the zig-zag dielectric slit 725 of the dielectric cavity 720. The conductive ridge 750 being a continuous ring interposed between the toroidal current sensor 741 and inner conductor 711 may effectively shield the current sensor 741 from the RF electric field.

As explained above, electrical contact between the grounded top cover 782 and the grounded bottom cover 784 in the region encircled by the toroidal current sensor 741 would diminish the strength of the magnetic field threading through the current pickup coil 747 and may excessively weaken the output signal of the current signal. So, the top of the conductive ridge 750 is electrically isolated from the top cover 782 by the zig-zag dielectric slit 725. The zig-zag shape of the dielectric region is indicated by a zig-zag dashed line in FIG. 7C.

Figure 7D:
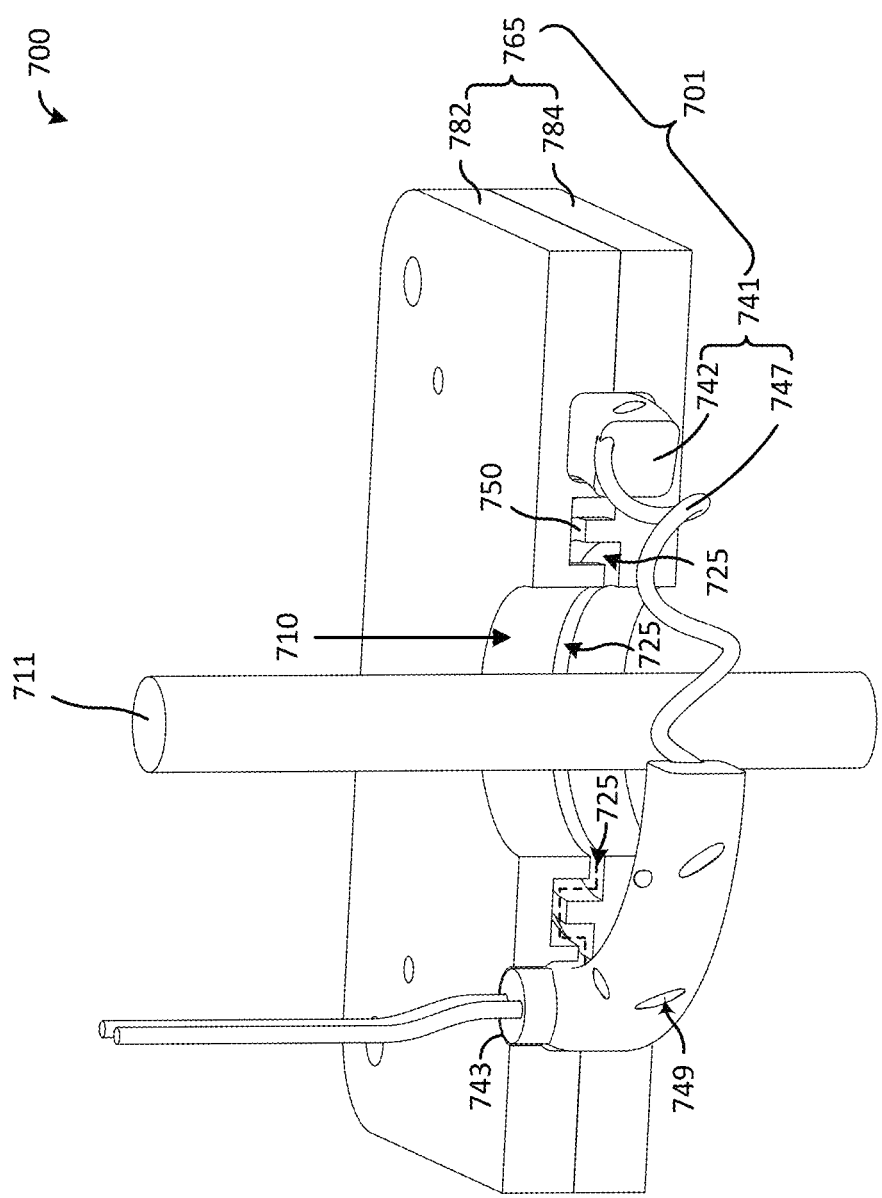
FIG. 7D illustrates a cutaway diagram of the current sensor assembly with an RF conductor for an RF pipe illustrated in FIG. 7C, in accordance with some embodiment.

The cutaway diagram of a portion of an RF system 700, illustrated in FIG. 7D, shows the current sensor assembly 701 with the top cover 782 fitted over the bottom cover 784. The zig-zag shape of the dielectric slit 725 has been indicated by a dashed zig-zag line in FIG. 7D.

Figure 7E:
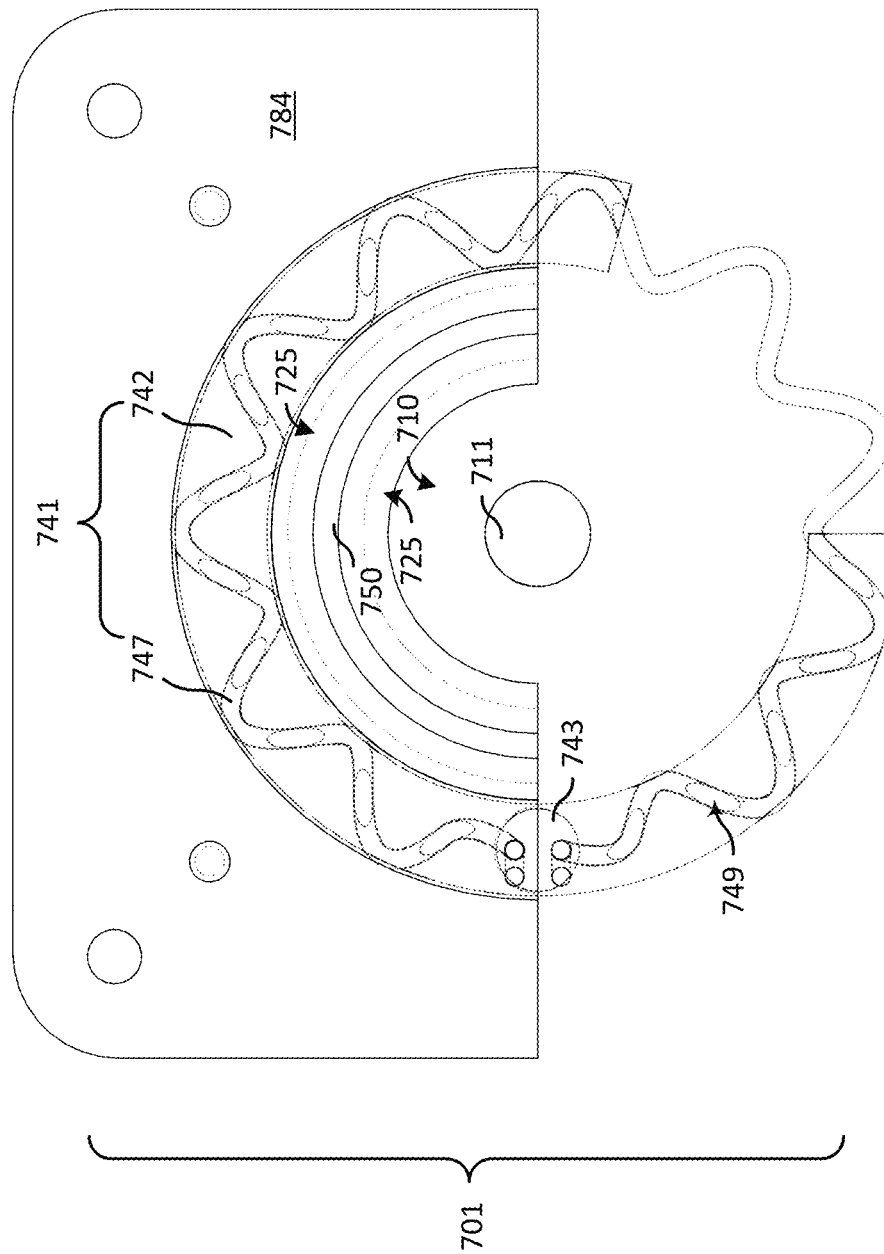
FIG. 7E illustrates a planar view of a bottom portion of the current sensor assembly with an RF conductor, illustrated in FIG. 7C.

FIG. 7E illustrates a planar view of a bottom portion of the current sensor assembly 701 and an inner conductor 711 of an RF pipe passing through the central hole 710 of the current sensor assembly. The current sensor 741 comprising the toroidal mandrel 742 and the current pickup coil 747 is shown over the bottom cover 784. The two opposite ends of the coil 747 are passing through holes in the attachment 743. The attachment 743 may be placed over an opening similar to the access hole 749. The ring-shaped conductive ridge 750 is seen interposed between the inner conductor 711 and the current sensor 741. The dielectric slit 725 is seen on either side of the conductive ridge 750.

The use of a mandrel, such as mandrels 642 and 742, permits a current sensor design to use a coil with many turns as the current pickup. The larger number of turns increases the sensitivity of the respective current sensor. The increased sensitivity allows each turn to have a smaller cross section and, thus, the size of the entire current sensor may be reduced, allowing the current sensor to be placed in otherwise inaccessible areas.

Although the mandrels described in this disclosure are shaped like a toroid, it is understood that other shapes may be used, for example, a square or a regular polygon having any number of sides. Furthermore, pickups of various shapes could be implemented without the use of a mandrel.

The various aspects of the embodiments described in this disclosure may be applied to fabricate V-I sensors using various other manufacturing techniques. For example, the current pickup can be manufactured in layers of dielectric and conductive material linked by vias, such as in printed circuit board (PCB) technology.

The embodiments of toroidal current sensors described above provide the advantages of axial symmetry of a torus, higher immunity to noise of multi-turn current pickups, and ease of use obtained with compact structures.

The V-I sensors and measurement methods, described in this disclosure, provide embodiments that may enable very high precision measurements at low manufacturing cost. High precision at low manufacturing cost may be achieved by including design features intended to reduce the sensitivity of the V-I measurements to machining errors and assembly errors. The precision of the current sensors depend on machining tolerance that causes variations in the dimensions that determine the geometry of the current pickup (e.g., the area enclosed by the rectangular half-loop). The precision in measuring current may also be limited by assembly tolerances, for example, the precision with which the current pickup may be placed, including the radial distance from the longitudinal axis and the angle between the plane of the half-loop and the longitudinal axis. The precision of the voltage measurement is likewise dependent on the machining tolerance (e.g., the accuracy in the diameter and circumference of the voltage pickup ring) and assembly tolerance (e.g., the angle between the plane of the ring and the longitudinal axis). The inventors have performed detailed computer simulations of the sensitivities of the V-I sensor signals to variations in dimensions and placements of the current and voltage pickups and found that a high precision of 1% may be achieved for a standard machine and placement tolerance value of 0.005 inches may be achieved. The computer simulations are done using a calibrated 3D finite element solver for Maxwell's equations over a wide range of RF power, RF frequency, and load impedance used in plasma processing.

Example embodiments of this application are summarized here. Other embodiments can also be understood from the entirety of the specification as well as the claims filed herein.

Example 1. A radio frequency (RF) sensor assembly includes a sensor casing disposed around a central hole, the sensor casing including a first conductive cover and a second conductive cover. The assembly includes a cavity disposed around the central hole and including a first dielectric material, the cavity being bounded by a first major outer surface and a second major outer surface along a radial direction from a center of the central hole, the first major outer surface including a continuous ring shaped region in physical contact with the central hole, and the second major outer surface at a radial distance greater than a radius of the first major outer surface, where the first conductive cover is electrically coupled to the second conductive cover through a coupling region beyond the second major outer surface of the cavity and, where the first conductive cover is electrically insulated from the second conductive cover by the cavity and the central hole. The assembly includes a current sensor electrically insulated from the sensor casing and including a current pickup disposed symmetrically around the central hole, the current pickup being disposed within the cavity and being insulated from the sensor casing.

Example 2. The sensor assembly of example 1, where the current sensor includes a mandrel shaped like a toroid.

Example 3. The sensor assembly of one of examples 1 or 2, where the mandrel includes a second dielectric material around a continuous hollow passage, the hollow passage coiling symmetrically around an internal circular axis, where the current pickup including a continuous conductive wire with two opposite ends, and where the wire is shaped like a coil threading through the hollow passage.

Example 4. The sensor assembly of one of examples 1 to 3, further including: a plurality of access holes extending from an outer surface of the mandrel to the hollow passage; and two electrical terminals insulated from the sensor casing, where the two electrical terminals are electrically connected to the respective two opposite ends of the wire extending out of the mandrel through the plurality of access holes.

Example 5. The sensor assembly of one of examples 1 to 4, where the mandrel includes a second dielectric material having grooves on an outer major surface of the mandrel, the grooves coiling symmetrically around an internal circular axis, where the current pickup includes a continuous conductive wire with two opposite ends, where the wire is shaped like a coil disposed in the grooves of the toroid.

Example 6. The sensor assembly of one of examples 1 to 5, further including: two electrical terminals insulated from the sensor casing, where the two electrical terminals are electrically coupled to the respective two opposite ends of the wire outside the mandrel.

Example 7. The current sensor of one of examples 1 to 6, where the mandrel and the current pickup are encapsulated with a resin.

Example 8. The sensor assembly of one of examples 1 to 7, further including a voltage sensor, the voltage sensor including a voltage pickup and an electrical terminal, where the voltage pickup is disposed in the cavity interposed between the current sensor and the central hole, and where the electrical terminal is electrically connected to the voltage pickup; and where the voltage sensor is electrically insulated from the sensor casing.

Example 9. The sensor assembly of one of examples 1 to 8, where the voltage pickup is an electrode shaped like a ring disposed symmetrically around the central hole, and where the voltage pickup is mechanically supported by a third dielectric material in the cavity disposed between the first conductive cover and the second conductive cover.

Example 10. The sensor assembly of one of examples 1 to 9, where the third dielectric material is a solid dielectric material and the first dielectric material is a gas.

Example 11. The voltage sensor of one of examples 1 to 10, where the voltage pickup is electrically insulated from the sensor casing by a slit region, the slit region including a continuous zig-zag region shaped like a ring, and where the slit region is in physical contact with the central hole, the voltage pickup, and the current sensor.

Example 12. A radio frequency (RF) sensor assembly includes a sensor casing disposed symmetrically around a central hole, the sensor casing including a first conductive cover and a second conductive cover. The assembly includes a cavity shaped like an annulus disposed symmetrically around the central hole and including a first dielectric material, the cavity being bounded by first and second major outer surfaces along a radial direction from a center of the central hole, the first major outer surface including a ring-shaped continuous region in physical contact with the central hole, and the second major outer surface including a closed outer boundary at a radial distance greater than a radius of the first major outer surface; a current sensor including a current pickup coil disposed symmetrically around the central hole, the current pickup being insulated from the sensor casing and the current pickup being disposed within the cavity. The assembly includes a conductive ridge shaped like a ring interposed between the current pickup and the central hole and electrically coupled to the second conductive cover, the conductive ridge being covered with the dielectric material.

Example 13. The sensor assembly of example 12, where the first conductive cover, along the radial direction from a center of the central hole, includes a first groove shaped like an annulus disposed vertically above the conductive ridge, at a radial distance farther from the central hole, a second groove shaped like an annulus, and a beam shaped like a ring including a conductive region between the first groove and the second groove; and where the second conductive cover includes a third groove shaped like an annulus disposed vertically below the beam and the second groove; and where the current sensor includes an upper portion disposed in the portion of the cavity including the second groove, and a lower portion disposed in the portion of the cavity including the third groove.

Example 14. The sensor assembly of one of examples 12 or 13, where the cavity, along the radial direction from a center of the central hole, includes a slit region, the slit region includes a continuous zig-zag dielectric region shaped like a ring, where the slit region is in physical contact with the central hole, the conductive ridge, and the current sensor.

Example 15. The sensor assembly of one of examples 12 to 14, where the first conductive cover is electrically coupled to the second conductive cover through a region beyond the second major outer surface of the cavity, and where the first conductive cover is electrically insulated from the second conductive cover by the cavity and the central hole in the region enclosed by the closed outer boundary.

Example 16. A plasma system including: a process chamber including an electrode; a radio frequency (RF) power source configured to power the process chamber with a RF signal; a RF pipe coupling the RF power source to the electrode of the process chamber; a mandrel shaped like a toroid disposed symmetrically around an axis of the RF pipe carrying the RF signal; and a voltage pickup disposed symmetrically around the axis of the RF pipe and surrounded by the mandrel.

Example 17. The system of example 16, further including a current sensor, the current sensor including: the mandrel including a dielectric material; and a current pickup including a continuous conductive wire with two opposite ends, where the wire is coiled symmetrically around an internal circular axis of the mandrel; and two electrical terminals electrically connected to the respective two opposite ends of the wire outside the mandrel.

Example 18. The plasma system of one of examples 16 or 17, further including a sensor assembly, the sensor assembly including a central hole, where an inner conductor of the RF pipe is disposed in the central hole; and a sensor casing shaped like an annulus disposed contiguously around the central hole and including a first conductive cover and a second conductive cover, the sensor casing being partitioned into a first annular region and a second annular region, the first annular region being contiguous with the central hole on one side and contiguous with the second annular region on the opposing side, and where, in the first annular region, the first conductive cover is electrically insulated from the second conductive cover by a cavity including a dielectric material, and where the mandrel and the voltage pickup are disposed in the cavity, and where, in the second annular region, the first conductive cover is electrically coupled to the second conductive cover.

Example 19. The plasma system of one of examples 16 to 18, where the first conductive cover and the second conductive cover in the first annular region of the sensor casing is electrically coupled to the outer conductor of the RF pipe, and where the first conductive cover and the second conductive cover in the second annular region of the sensor casing is electrically coupled to the outer conductor of the RF pipe.

Example 20. The plasma system of one of examples 16 to 19, further including a voltage sensor, the voltage sensor including the voltage pickup and an electrical terminal, where the voltage sensor is electrically insulated from the sensor casing, and where the voltage pickup is an electrode shaped like a ring disposed symmetrically around a central hole, where the voltage pickup is mechanically supported by a solid dielectric material in a cavity disposed between the first conductive cover and the second conductive cover, and where the voltage pickup is electrically coupled to the electrical terminal.

Example 21. The plasma system of one of examples 16 to 20, where the voltage pickup is electrically insulated from the sensor casing by a slit region, the slit region including a continuous zig-zag dielectric region shaped like a ring, where the slit region is in physical contact with the central hole, the voltage pickup, and the mandrel.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A radio frequency (RF) sensor assembly comprising:
a sensor casing disposed symmetrically around a central hole, the sensor casing comprising a first conductive cover and a second conductive cover;
a cavity shaped like an annulus disposed symmetrically around the central hole and comprising a first dielectric material, the cavity being bounded by first and second major outer surfaces along a radial direction from a center of the central hole, the first major outer surface comprising a ring-shaped continuous region in physical contact with the central hole, and the second major outer surface comprising a closed outer boundary at a radial distance greater than a radius of the first major outer surface;
a current sensor comprising a current pickup coil disposed symmetrically around the central hole, the current pickup being insulated from the sensor casing and the current pickup being disposed within the cavity; and
a conductive ridge shaped like a ring interposed between the current pickup and the central hole and electrically coupled to the second conductive cover, the conductive ridge being covered with the dielectric material.

2. The sensor assembly of claim 1,
wherein the first conductive cover, along the radial direction from a center of the central hole, comprises
a first groove shaped like an annulus disposed vertically above the conductive ridge,
at a radial distance farther from the central hole, a second groove shaped like an annulus, and
a beam shaped like a ring comprising a conductive region between the first groove and the second groove; and
wherein the second conductive cover comprises a third groove shaped like an annulus disposed vertically below the beam and the second groove; and
wherein the current sensor comprises an upper portion disposed in the portion of the cavity comprising the second groove, and a lower portion disposed in the portion of the cavity comprising the third groove.

3. The sensor assembly of claim 1,
wherein the cavity, along the radial direction from a center of the central hole, comprises a slit region, the slit region comprises a continuous zig-zag dielectric region shaped like a ring,
wherein the slit region is in physical contact with the central hole, the conductive ridge, and the current sensor.

4. The sensor assembly of claim 1, wherein the first conductive cover is electrically coupled to the second conductive cover through a region beyond the second major outer surface of the cavity, and wherein the first conductive cover is electrically insulated from the second conductive cover by the cavity and the central hole in the region enclosed by the closed outer boundary.

5. A radio frequency (RF) sensor assembly comprising:
a sensor casing comprising a first conductive cover, a second conductive cover, and a central hole extending through the first and the second conductive covers;
a cavity shaped like an annulus disposed symmetrically around the central hole and comprising an inner groove and an outer groove, the inner and outer grooves comprising a dielectric material;
a current sensor comprising a mandrel and a current pickup disposed within the mandrel, the current sensor being disposed within the cavity between the inner and outer grooves, the current pickup being insulated from the sensor casing by the outer groove; and
a conductive ridge shaped like a ring interposed between the current pickup and the central hole and electrically coupled to the second conductive cover, the conductive ridge being covered with the dielectric material.

6. The sensor assembly of claim 5, wherein the mandrel comprises a toroidal shape.

7. The sensor assembly of claim 5, wherein outside the outer groove, the first conductive cover and the second conductive cover are physically and electrically coupled together, and wherein inside the outer groove, the first conductive cover and the second conductive cover are isolated.

8. The sensor assembly of claim 5, further comprising a dielectric slit comprising the dielectric material disposed over the inner and outer grooves on either side of the conductive ridge, wherein a conductive floor of the cavity is electrically and physically separated from a conductive roof of the cavity by an unbroken continuous dielectric region.

9. The sensor assembly of claim 5, wherein the mandrel comprises access holes for a conducting wire.

10. The sensor assembly of claim 5, wherein the cavity is bounded by first and second major outer surfaces along a radial direction from a center of the central hole, the first major outer surface comprising a ring-shaped continuous region in physical contact with the central hole, and the second major outer surface comprising a closed outer boundary at a radial distance greater than a radius of the first major outer surface.

11. The sensor assembly of claim 10,
wherein the cavity, along the radial direction from a center of the central hole, comprises a slit region, the slit region comprises a continuous zig-zag dielectric region shaped like a ring,
wherein the slit region is in physical contact with the central hole, the conductive ridge, and the current sensor.

12. The sensor assembly of claim 10, wherein the first conductive cover is electrically coupled to the second conductive cover through a region beyond the second major outer surface of the cavity, and wherein the first conductive cover is electrically insulated from the second conductive cover by the cavity and the central hole in the region enclosed by the closed outer boundary.

13. A plasma system comprising:
a process chamber comprising an electrode;
a radio frequency (RF) power source configured to power the process chamber with a RF signal;
a RF pipe coupling the RF power source to the electrode of the process chamber;
a mandrel shaped like a toroid disposed symmetrically around an axis of the RF pipe carrying the RF signal; and
a voltage pickup disposed symmetrically around the axis of the RF pipe and surrounded by the mandrel.

14. The system of claim 13, further comprising a current sensor, the current sensor comprising:
the mandrel comprising a dielectric material; and
a current pickup comprising a continuous conductive wire with two opposite ends, wherein the wire is coiled symmetrically around an internal circular axis of the mandrel; and
two electrical terminals electrically connected to the respective two opposite ends of the wire outside the mandrel.

15. The plasma system of claim 13, further comprising a sensor assembly, the sensor assembly comprising
a central hole, wherein an inner conductor of the RF pipe is disposed in the central hole; and
a sensor casing shaped like an annulus disposed contiguously around the central hole and comprising a first conductive cover and a second conductive cover, the sensor casing being partitioned into a first annular region and a second annular region,
the first annular region being contiguous with the central hole on one side and contiguous with the second annular region on the opposing side, and
wherein, in the first annular region, the first conductive cover is electrically insulated from the second conductive cover by a cavity comprising a dielectric material, and wherein the mandrel and the voltage pickup are disposed in the cavity, and
wherein, in the second annular region, the first conductive cover is electrically coupled to the second conductive cover.

16. The plasma system of claim 15,
wherein the first conductive cover and the second conductive cover in the first annular region of the sensor casing is electrically coupled to the outer conductor of the RF pipe, and
wherein the first conductive cover and the second conductive cover in the second annular region of the sensor casing is electrically coupled to the outer conductor of the RF pipe.

17. The plasma system of claim 13, further comprising a voltage sensor, the voltage sensor comprising the voltage pickup and an electrical terminal,
wherein the voltage sensor is electrically insulated from the sensor casing, and
wherein the voltage pickup is an electrode shaped like a ring disposed symmetrically around a central hole,
wherein the voltage pickup is mechanically supported by a solid dielectric material in a cavity disposed between the first conductive cover and the second conductive cover, and
wherein the voltage pickup is electrically coupled to the electrical terminal.

18. The plasma system of claim 17, wherein the voltage pickup is electrically insulated from the sensor casing by a slit region, the slit region comprising a continuous zig-zag dielectric region shaped like a ring, wherein the slit region is in physical contact with the central hole, the voltage pickup, and the mandrel.

\* \* \* \* \*